United States Patent
Nishimura et al.

(10) Patent No.: US 9,469,729 B2
(45) Date of Patent: *Oct. 18, 2016

(54) TRIAZINE RING-CONTAINING POLYMER AND FILM-FORMING COMPOSITION CONTAINING SAME

(71) Applicant: NISSAN CHEMICAL INDUSTRIES, LTD., Chiyoda-ku, Tokyo (JP)

(72) Inventors: Naoya Nishimura, Funabashi (JP); Yasuyuki Koide, Funabashi (JP); Masaaki Ozawa, Funabashi (JP)

(73) Assignee: NISSAN CHEMICAL INDUSTRIES, LTD., Tokyo (JP)

( * ) Notice: Subject to any disclaimer, the term of this patent is extended or adjusted under 35 U.S.C. 154(b) by 0 days.

This patent is subject to a terminal disclaimer.

(21) Appl. No.: 14/678,426

(22) Filed: Apr. 3, 2015

(65) Prior Publication Data

US 2015/0210808 A1    Jul. 30, 2015

Related U.S. Application Data

(62) Division of application No. 13/882,679, filed as application No. PCT/JP2011/074749 on Oct. 27, 2011, now Pat. No. 9,243,110.

(30) Foreign Application Priority Data

Nov. 1, 2010   (JP) ................. 2010-245380

(51) Int. Cl.
| | |
|---|---|
| H01L 31/0216 | (2014.01) |
| C08G 75/04 | (2016.01) |
| C08G 16/00 | (2006.01) |
| C08G 69/00 | (2006.01) |
| H01L 31/0232 | (2014.01) |
| C08L 79/04 | (2006.01) |
| C08L 81/02 | (2006.01) |
| C08L 61/00 | (2006.01) |
| C08L 77/00 | (2006.01) |
| C08L 81/06 | (2006.01) |
| C08G 73/06 | (2006.01) |
| C08G 75/20 | (2016.01) |
| G02B 1/04 | (2006.01) |
| H01L 51/00 | (2006.01) |
| C09D 177/10 | (2006.01) |
| C09D 179/04 | (2006.01) |
| C08G 73/02 | (2006.01) |
| H01L 27/146 | (2006.01) |
| H01L 27/148 | (2006.01) |

(52) U.S. Cl.
CPC ......... *C08G 73/0644* (2013.01); *C08G 73/028* (2013.01); *C08G 73/0273* (2013.01); *C09D 177/10* (2013.01); *C09D 179/04* (2013.01); *G02B 1/04* (2013.01); *H01L 27/1462* (2013.01); *H01L 27/14621* (2013.01); *H01L 27/14645* (2013.01); *H01L 27/14806* (2013.01); *H01L 27/14868* (2013.01); *H01L 51/0035* (2013.01); *H01L 51/0043* (2013.01); *G02F 2202/022* (2013.01); *G02F 2202/40* (2013.01)

(58) Field of Classification Search
None
See application file for complete search history.

(56) References Cited

U.S. PATENT DOCUMENTS

| | | | |
|---|---|---|---|
| 4,409,348 | A | 10/1983 | Wiezer et al. |
| 5,886,130 | A | 3/1999 | Trimmer et al. |
| 8,618,243 | B2 | 12/2013 | Nishimura et al. |
| 2009/0318725 | A1 | 12/2009 | Takeuchi |
| 2012/0049308 | A1 | 3/2012 | Nishimura et al. |

FOREIGN PATENT DOCUMENTS

| | | |
|---|---|---|
| CN | 101717396 | 6/2010 |
| EP | 0 925 319 A1 | 6/1999 |
| JP | 32-3145 | 5/1957 |

(Continued)

OTHER PUBLICATIONS

Extended European Search Report issued Apr. 4, 2014, in European Patent Application No. 11837918.9.

(Continued)

*Primary Examiner* — Susannah Chung
*Assistant Examiner* — Robert T Butcher
(74) *Attorney, Agent, or Firm* — Birch, Stewart, Kolasch & Birch, LLP

(57) ABSTRACT

A polymer containing a repeating unit structure having a triazine ring such as, for example, that which is represented by formula (25): can exhibit alone high heat resistance, high transparency, high refractive index, high solubility and low volume shrinkage; and can be used as a component in a film-forming composition as appropriate.

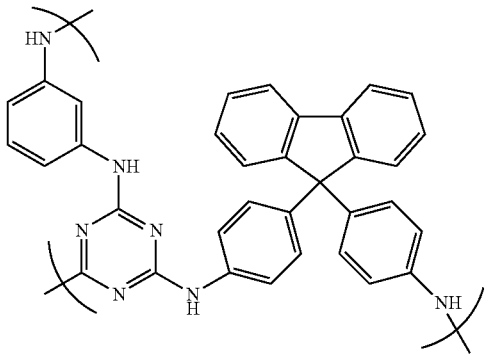

(25)

18 Claims, 8 Drawing Sheets

(56) References Cited

FOREIGN PATENT DOCUMENTS

Figure 1:
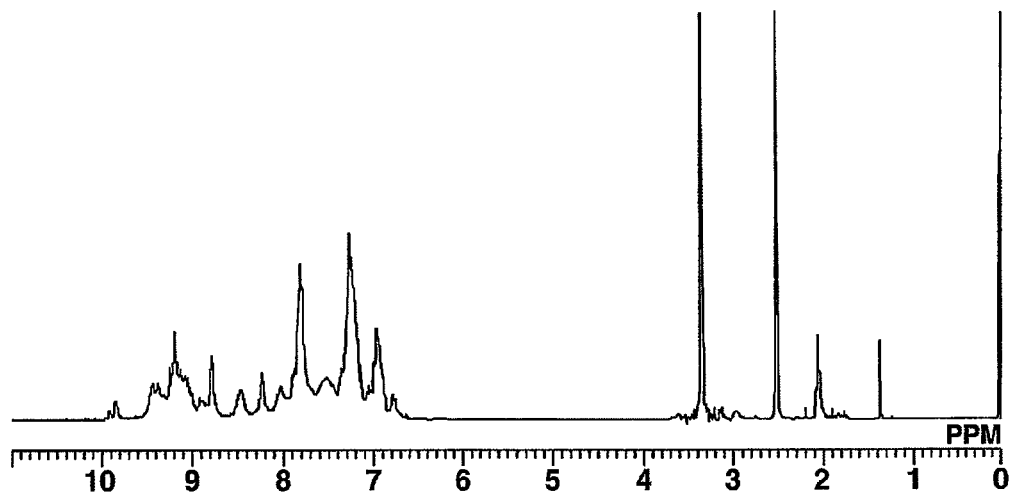

| JP | 57-187321 A | 11/1982 |
|---|---|---|
| JP | 7-113009 A | 5/1995 |
| JP | 2000-53659 A | 2/2000 |
| JP | 2001-503077 A | 3/2001 |
| JP | 2007-246877 A | 9/2007 |
| JP | 2008-24832 A | 2/2008 |
| WO | WO 2010/128660 A1 | 11/2010 |
| WO | WO 2010/128661 A1 | 11/2010 |

OTHER PUBLICATIONS

International Search Report issued in PCT/JP2011/074749 mailed Jan. 31, 2012.
Machine Translation of An et al. CN 101717396 A (Jun. 2, 2010), pp. 1-8.
Mahapatra et al., Poly. Degrad. and Stab. 92 (2007) 947-955.
Mahapatra et al., Polym. J., 41, No. 1, 20-25, (2009).
Mahapatra, S. S. and N. Karak, "Fluorescent Hyperbranched Polyamine with s-Triazine: Synthesis, Characterization and Properties Evaluation," Polymer Journal (2009), vol. 41, No. 1, pp. 20-25.
Mahapatra, S.S. et al., "Effect of structure and concentration of polymer, metal ion and pH of the medium on the fluorescence characteristics of hyperbranched polyamines," Journal of Luminescence, vol. 128, No. 12, 2008, pp. 1917-1921.
Mahapatra, S.S. et al., "Hyperbranched Aromatic Polyamines with s-Triazine Rings," Journal of Applied Polymer Science, vol. 106, 2007, pp. 95-102.
Takagi et al., "Triazine Dendrimers by Divergent and Convergent Methods," J. Polym. Sci. A: Poly. Chem. (2000), vol. 38, pp. 4385-4395.
Wen et al., "Hyperbranched triazine-containing polyfluorenes: Efficient blue emitters for polymer light-emitting diodes (PLEDs)," Polymer (2007), vol. 48, pp. 1824-1829.
Zhang, W. et al., "Structure-Activity Relationships in Dendrimers Based on Triazines: Gelation Depends on Choice of Linking and Surface Groups," Macromolecules, vol. 35, No. 24, 2002, pp. 9015-9021.

9,469,729 B2

TRIAZINE RING-CONTAINING POLYMER AND FILM-FORMING COMPOSITION CONTAINING SAME

CROSS REFERENCE

This application is a 37 CFR 1.53(b) divisional of, and claims priority to, application Ser. No. 13/882,679, filed Jul. 12, 2013, now U.S. Pat. No. 9,243,110 (issued Jan. 26, 2016). Application Ser. No. 13/882,679 is the national phase under 35 U.S.C. §371 of International Application No. PCT/JP2011/074749, filed on Oct. 27, 2011. Priority is also claimed to Japanese Application No. 2010-245380, filed on Nov. 1, 2010. The entire contents of each of the foregoing applications are incorporated by reference herein.

TECHNICAL FIELD

The present invention relates to a triazine ring-containing polymer and a film-forming composition containing the same.

BACKGROUND ART

Various efforts have hitherto been made to increase the functionality of polymeric compounds. For example, in one approach currently used to increase the refractive index of polymeric compounds, aromatic rings, halogen atoms or sulfur atoms are introduced onto the compound. Of such compounds, episulfide polymeric compounds and thiourethane polymeric compounds, both of which have sulfur atoms introduced thereon, are in practical use today as high-refractive index lenses for eyeglasses.

However, given that material design to a refractive index above 1.7 is difficult with a polymer alone, the most effective method for achieving an even higher refractive index is known to involve the use of inorganic metal oxides.

For example, a method for increasing the refractive index by using a hybrid material composed of a siloxane polymer mixed with a material containing small dispersed particles of zirconia, titania or the like has been disclosed (Patent Document 1).

A method in which a condensed ring skeleton having a high refractive index is introduced onto portions of a siloxane polymer has also been disclosed (Patent Document 2).

In addition, numerous attempts have been made to impart heat resistance to polymeric compounds. Specifically, it is well known that the heat resistance of polymeric compounds can be improved by introducing aromatic rings. For example, polyarylene copolymers with substituted arylene recurring units on the backbone have been disclosed (Patent Document 3). Such polymeric compounds show promise primarily in use as heat-resistant plastics.

Melamine resins are familiar as triazine resins, but have a very low decomposition temperature compared with heat-resistant materials such as graphite.

The heat-resistant organic materials composed of carbon and nitrogen that have been in use up until now are for the most part aromatic polyimides and aromatic polyamides. However, because these materials have straight-chain structures, their heat-resistance temperatures have not been all that high.

Triazine-based condensation materials have also been reported as nitrogen-containing polymeric materials having heat resistance (Patent Document 4).

In recent years, there has arisen a need for high-performance polymeric materials in the development of electronic devices such as liquid-crystal displays, organic electroluminescent (EL) displays, optical semiconductor (LED) devices, solid-state image sensors, organic thin-film solar cells, dye-sensitized solar cells and organic thin-film transistors (TFT).

The specific properties desired in such polymeric materials include (1) heat resistance, (2) transparency, (3) high refractive index, (4) high solubility, and (5) low volume shrinkage.

However, because the high refractive index lens materials for eyeglasses mentioned above generally have a poor heat resistance, requiring that production be carried out in a temperature range no higher than 200° C., materials of this type are unsuitable for processes such as baking in open air at 300° C.

Moreover, because polymeric compounds in which aromatic rings or triazine rings have been introduced generally have an inadequate solubility in solvents, they are insoluble in resist solvents which are safe solvents. On the other hand, materials which exhibit a high solubility generally have a low transparency.

In materials that use inorganic metal oxides, there is a trade-off between refractive index and transparency, which makes it difficult to increase the transparency while retaining a high refractive index.

Moreover, given that this material contains fine particles of differing characteristics, in the course of a dry process such as etching or ashing, the etch rate becomes unstable, making a film of uniform thickness difficult to obtain, and also resulting in a narrower process margin during device fabrication.

Highly branched polymers are broadly divided into hyperbranched polymers and dendrimers.

As used herein, "hyperbranched polymer" refers to a highly branched polymer with an irregular branched structure that is obtained by, for example, polymerizing ABx-type polyfunctional monomers (where A and B represent functional groups that react with each other, and "x" on B is a number equal to 2 or more).

"Dendrimer" refers to a highly branched polymer which has a regular branched structure. Hyperbranched polymers are characterized by being easier to synthesize than dendrimers, and by the ease with which high-molecular-weight bodies can be synthesized.

Triazine ring-containing hyperbranched polymers have reportedly been synthesized for flame retardant applications (Non-Patent Document 1).

PRIOR ART DOCUMENTS

Patent Documents

Patent Document 1: JP-A 2007-246877
Patent Document 2: JP-A 2008-24832
Patent Document 3: U.S. Pat. No. 5,886,130
Patent Document 4: JP-A 2000-53659

Non-Patent Documents

Non-Patent Document 1: *Journal of Applied Polymer Science*, 106, 95-102 (2007)

SUMMARY OF THE INVENTION

Problems to be Solved by the Invention

It is therefore an object of the present invention to provide a triazine ring-containing polymer which is able by itself, without the addition of a metal oxide, to achieve a high heat resistance, high transparency, high refractive index, high solubility and low volume shrinkage. A further object of the invention is to provide a film-forming composition containing such a polymer.

Means for Solving the Problems

The inventors earlier discovered that hyperbranched polymers containing recurring units with a triazine ring and an aromatic ring have a refractive index greater than 1.7 and are able, with the polymer alone, to achieve a high heat resistance, high transparency, high refractive index, high solubility and low volume shrinkage, and are thus suitable as film-forming compositions in the fabrication of electronic devices (International Application PCT/JP 2010/057761).

Based on these findings, the inventors have conducted further investigations and discovered copolymeric hyperbranched polymers which have even better refractive indices, better heat resistances, and better solubilities in various organic solvents.

Accordingly, the invention provides:
1. A triazine ring-containing polymer characterized by including a recurring unit structure of formula (1) below

[Chemical Formula 1]

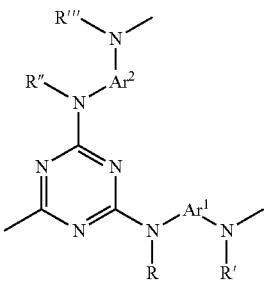

(1)

(wherein R, R', R" and R'" are each independently a hydrogen atom, an alkyl group, an alkoxy group, an aryl group or an aralkyl group; $Ar^1$ and $Ar^2$ are each independently at least one selected from the group consisting of formulas (2) to (18) below

[Chemical Formula 2]

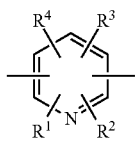

(2)

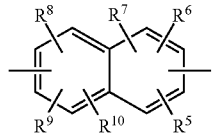

(3)

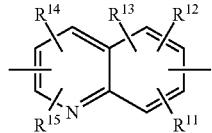

(4)

-continued

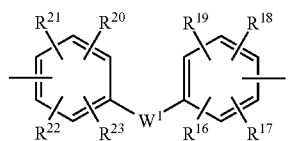

(5)

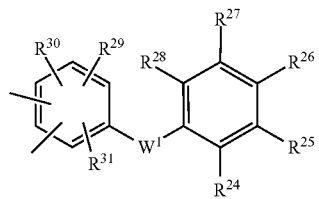

(6)

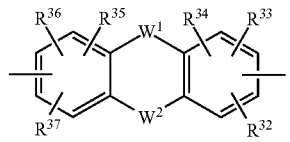

(7)

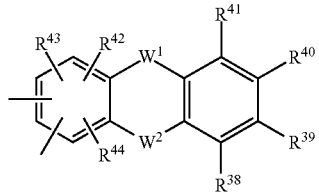

(8)

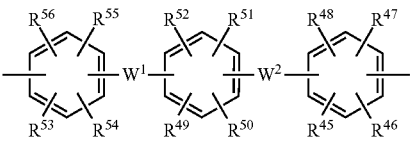

(9)

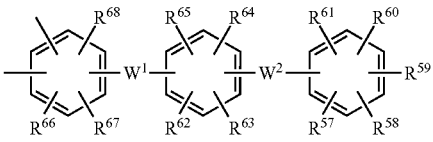

(10)

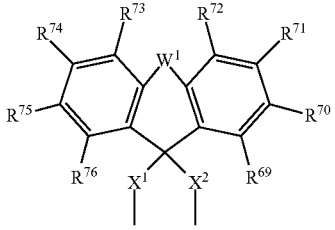

(11)

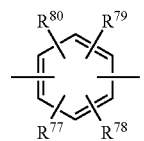

(12)

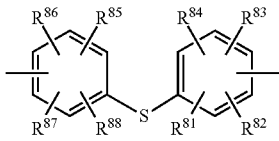

(13)

-continued

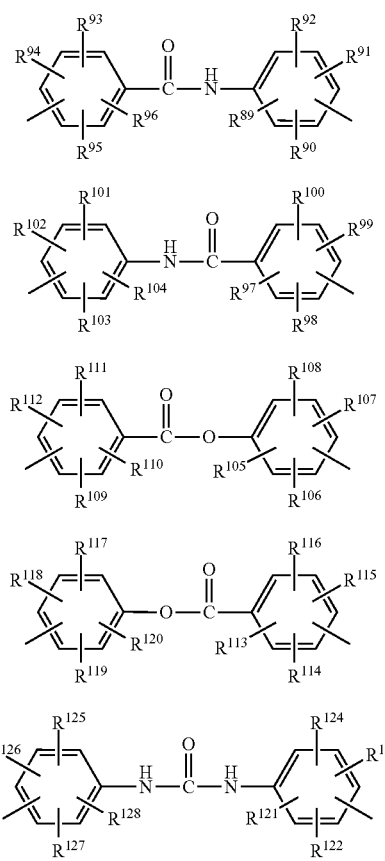

(wherein $R^1$ to $R^{128}$ are each independently a hydrogen atom, a halogen atom, a carboxyl group, a sulfonyl group, an alkyl group which may have a branched structure of 1 to 10 carbons, or an alkoxy group which may have a branched structure of 1 to 10 carbons; $W^1$ and $W^2$ are each independently a single bond, $CR^{129}R^{130}$ ($R^{129}$ and $R^{130}$ being each independently a hydrogen atom or an alkyl group which may have a branched structure of 1 to 10 carbons, with the proviso that $R^{129}$ and $R^{130}$ may together form a ring), C=O, O, S, SO, SO$_2$ or $NR^{131}$ ($R^{131}$ being a hydrogen atom or an alkyl group which may have a branched structure of 1 to 10 carbons); and $X^1$ and $X^2$ are each independently a single bond, an alkylene group which may have a branched structure of 1 to 10 carbons, or a group of formula (19) below

[Chemical Formula 3]

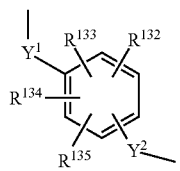

($R^{132}$ to $R^{135}$ being each independently a hydrogen atom, a halogen atom, a carboxyl group, a sulfonyl group, an alkyl group which may have a branched structure of 1 to 10 carbons, or an alkoxy group which may have a branched structure of 1 to 10 carbons; and $Y^1$ and $Y^2$ being each independently a single bond or an alkylene group which may have a branched structure of 1 to 10 carbons));

2. The triazine ring-containing polymer according to 1 above, wherein the combination of $Ar^1$ and $Ar^2$ is two selected from the group consisting of formulas (5) to (12) and formulas (14) to (18);

3. The triazine ring-containing polymer according to 1 above, wherein the combination of $Ar^1$ and $Ar^2$ is two selected from the group consisting of formulas (7), (11), (12), (14) and (15);

4. The triazine ring-containing polymer according to 1 above, wherein the combination of $Ar^1$ and $Ar^2$ is two selected from the group consisting of formulas (20) to (24) below

[Chemical Formula 4]

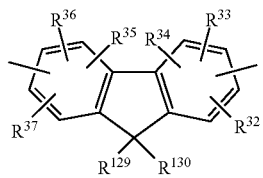

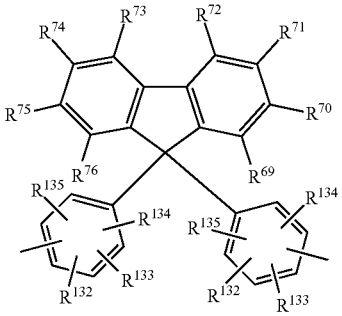

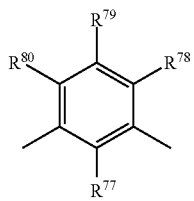

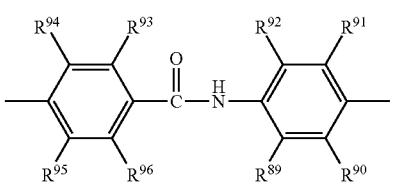

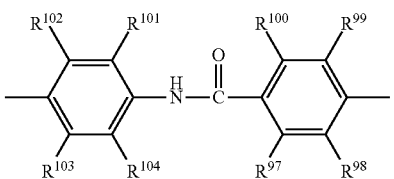

(wherein $R^{32}$ to $R^{37}$, $R^{69}$ to $R^{80}$, $R^{89}$ to $R^{104}$, $R^{129}$, $R^{130}$ and $R^{132}$ to $R^{135}$ are as defined above);

5. The triazine ring-containing polymer according to 1 above, wherein the recurring unit structure includes the structure of formula (25) below

[Chemical Formula 5]

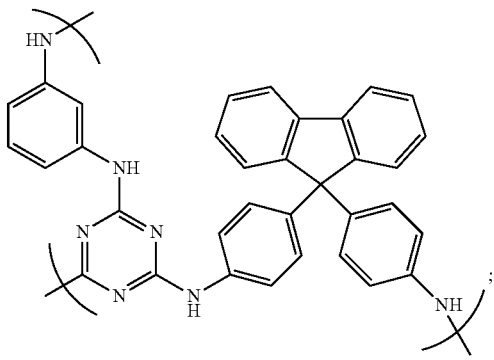

(25)

6. The triazine ring-containing polymer according to 1 above, wherein the recurring unit structure includes the structure of formula (26) below

[Chemical Formula 6]

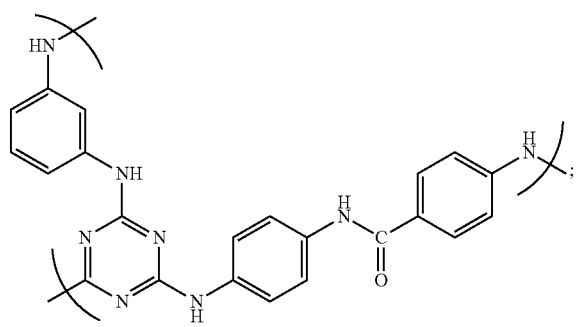

(26)

7. The triazine ring-containing polymer according to 1 above, wherein the recurring unit structure includes the structure of formula (27) below

[Chemical Formula 7]

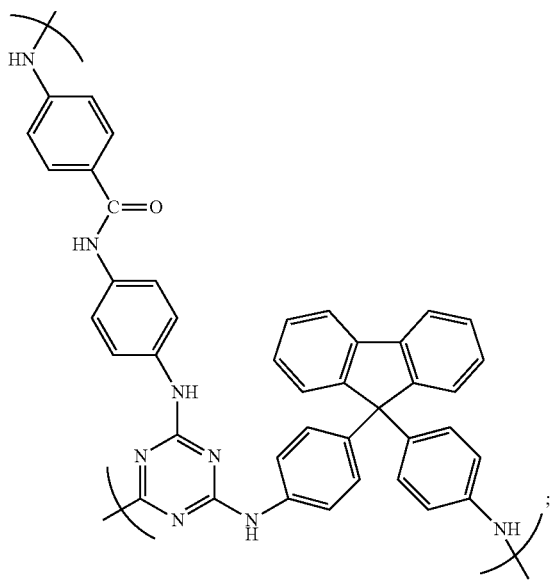

(27)

8. The triazine ring-containing polymer according to any one of 1 to 7 above, wherein the polymer is capped on at least one end by an alkyl, aralkyl, aryl, alkylamino, alkoxysilyl-containing alkylamino, aralkylamino, arylamino, alkoxy, aralkyloxy, aryloxy or ester group;

9. The triazine ring-containing polymer according to 8 above, wherein the polymer has at least one terminal triazine ring, which terminal triazine ring is capped by an alkyl, aralkyl, aryl, alkylamino, alkoxysilyl-containing alkylamino, aralkylamino, arylamino, alkoxy, aralkyloxy, aryloxy or ester group;

10. A film-forming composition which includes the triazine ring-containing polymer of any one of 1 to 9 above;

11. A film obtained from the film-forming composition of 10 above;

12. A film which includes the triazine ring-containing polymer according to any one of 1 to 9 above;

13. An electronic device having a base material and the film of 11 or 12 above formed on the base material;

14. An optical member having a base material and the film of 11 or 12 above formed on the base material;

15. A solid-state image sensor formed of a charge-coupled device or a complementary metal oxide semiconductor, the sensor having at least one layer of the film of 11 or 12 above;

16. A solid-state image sensor having, as a planarization layer on a color filter, the film of 11 or 12 above; and 17. A lens material, planarizing material or embedding material for a solid-state image sensor, the material being made of the film-forming composition of 10 above.

Advantageous Effects of the Invention

This invention is able to provide a triazine ring-containing polymer which is capable of achieving by itself, without the use of a metal oxide: high heat resistance, high transparency, high refractive index, high solubility and low volume shrinkage.

By employing the above polymer skeleton, a high heat resistance and a high transparency can be maintained even in cases where (1) a secondary amine is used as a polymer spacer, and (2) a primary amine is substituted at the chain ends.

The reason why the hyperbranched polymer of the invention manifests a high refractive index is thought to be due to the fact that, because the polymer has a hyperbranched structure, the triazine rings and aryl (Ar) moieties gather together closely, raising the electron density.

In particular, it is thought that when at least one of R, R', R" and R'" above is a hydrogen atom, owing to the hyperbranched structure of the polymer, the nitrogen atoms on the triazine rings and the hydrogen atoms at amine sites form hydrogen bonds, causing the triazine rings and aryl (Ar) moieties to cluster together even more closely and further increasing the electron density.

Also, although this is a compound having a high molecular weight, owing to its excellent solubility in various organic solvents and its low viscosity when dissolved in a solvent, the handleability is excellent.

Moreover, because the triazine ring-containing polymer of the invention is able by itself, without including a metal oxide, to exhibit a high refractive index, even in the course of a dry process such as etching or ashing, the etch rate is constant, enabling a film of uniform thickness to be obtained, and thus widening the process margin during device fabrication.

In addition, the triazine ring-containing polymer of the invention can be used as a highly heat-resistant insulating material.

Films produced using the triazine ring-containing polymer of the invention having characteristics such as those mentioned above can be advantageously used as components in the fabrication of electronic devices such as liquid-crystal displays, organic electroluminescent (EL) displays, optical semiconductor (LED) devices, solid-state image sensors, organic thin-film solar cells, dye-sensitized solar cells and organic thin-film transistors (TFT).

In particular, such films can be advantageously used as the following solid-state image sensor components which are required to have especially high refractive indices: embedding films and planarizing films on photodiodes, planarizing films before and after color filters, microlenses, planarizing films on microlenses, and conformal films.

BRIEF DESCRIPTION OF THE DIAGRAMS

Figure 2:
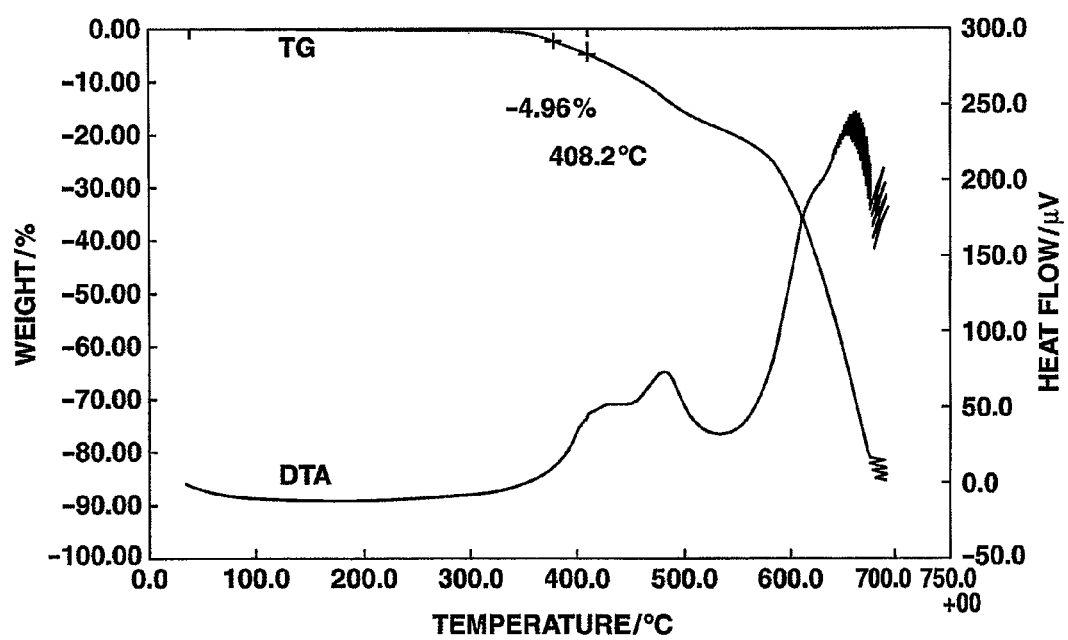
Figure 3:
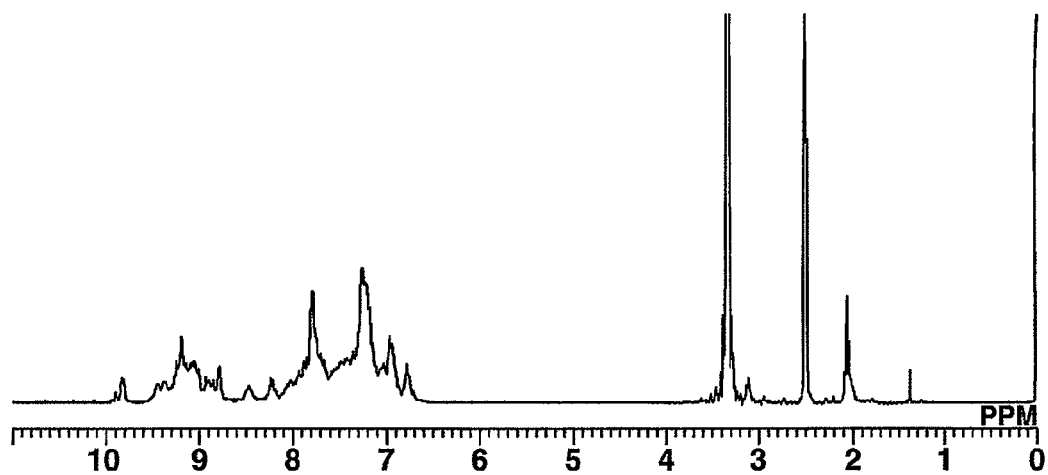
Figure 4:
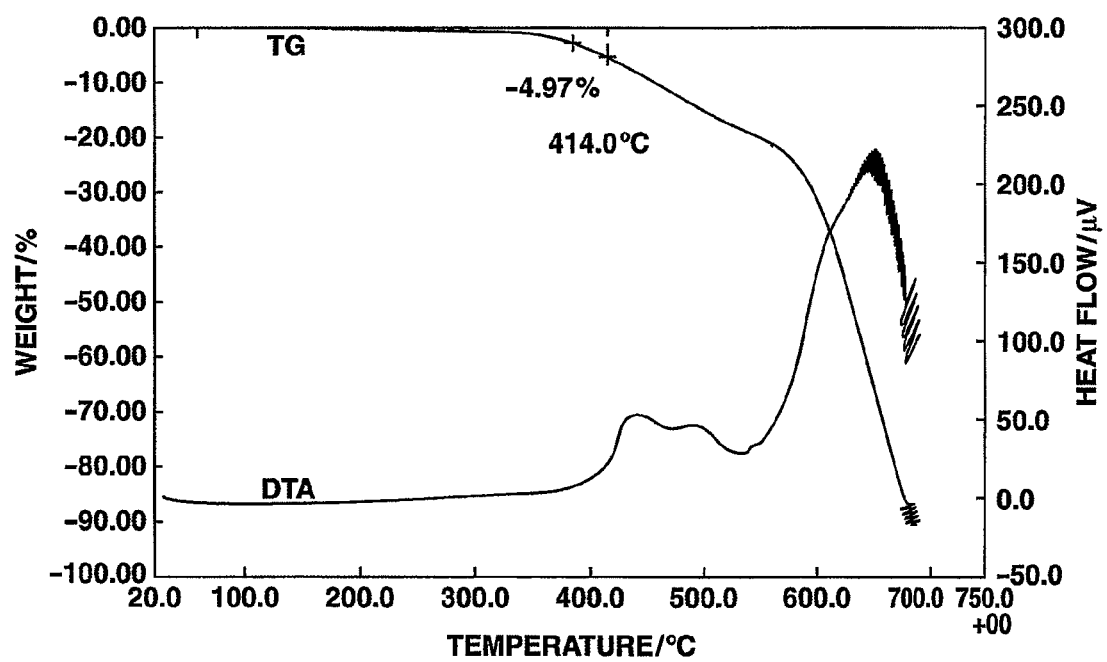
Figure 5:
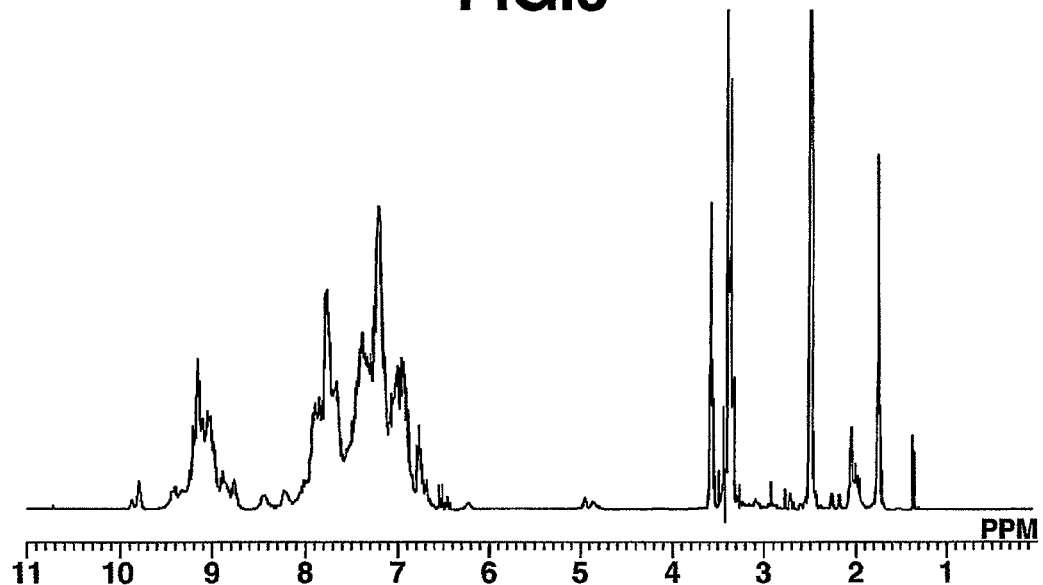
Figure 6:
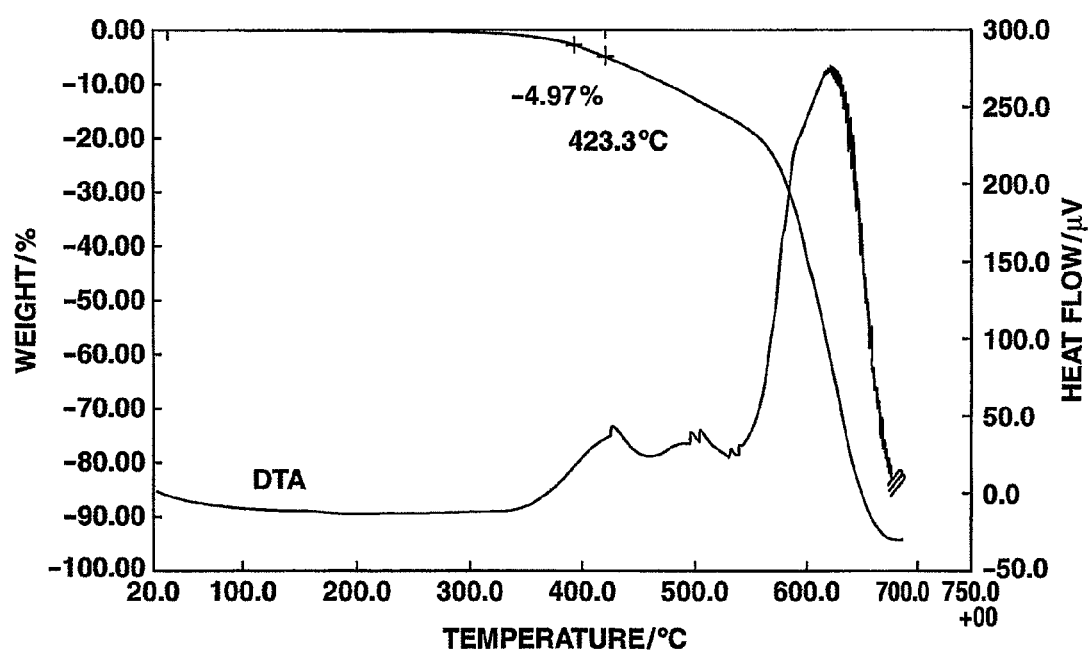
Figure 7:
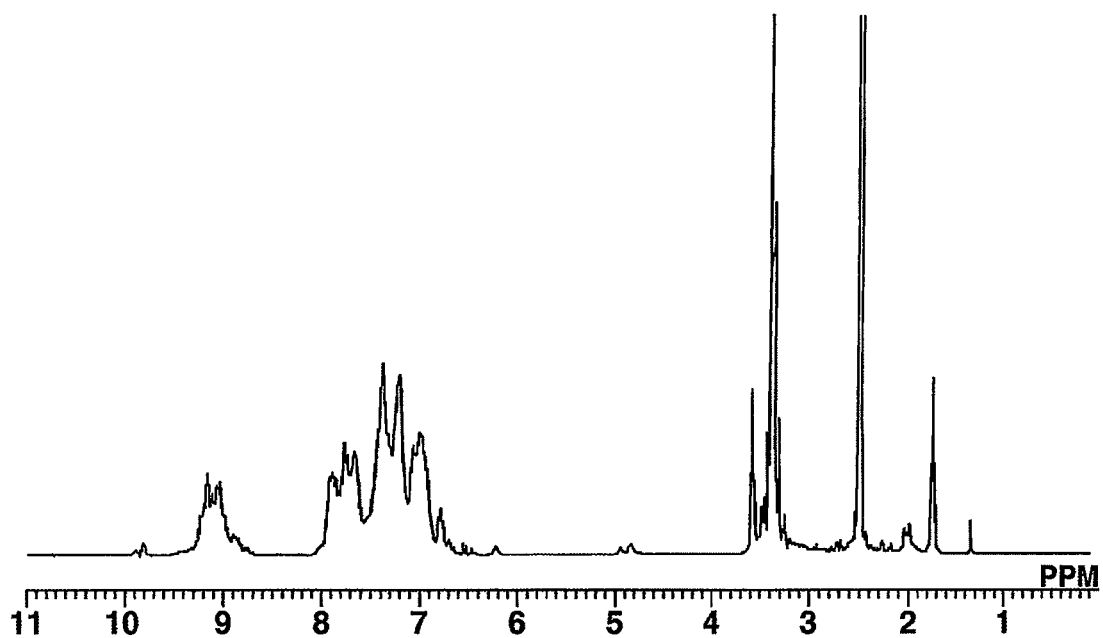
Figure 8:
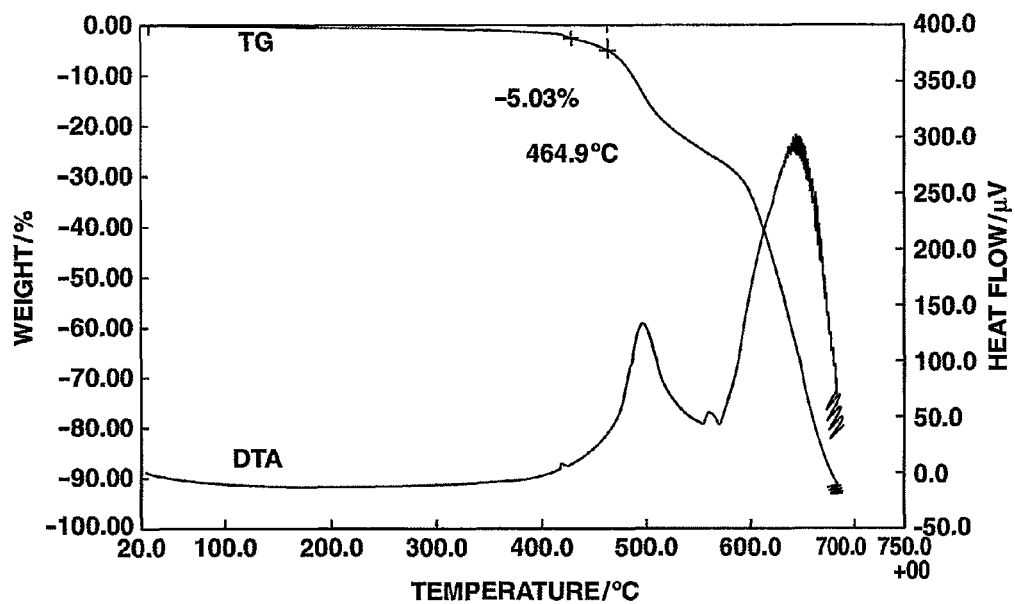
Figure 9:
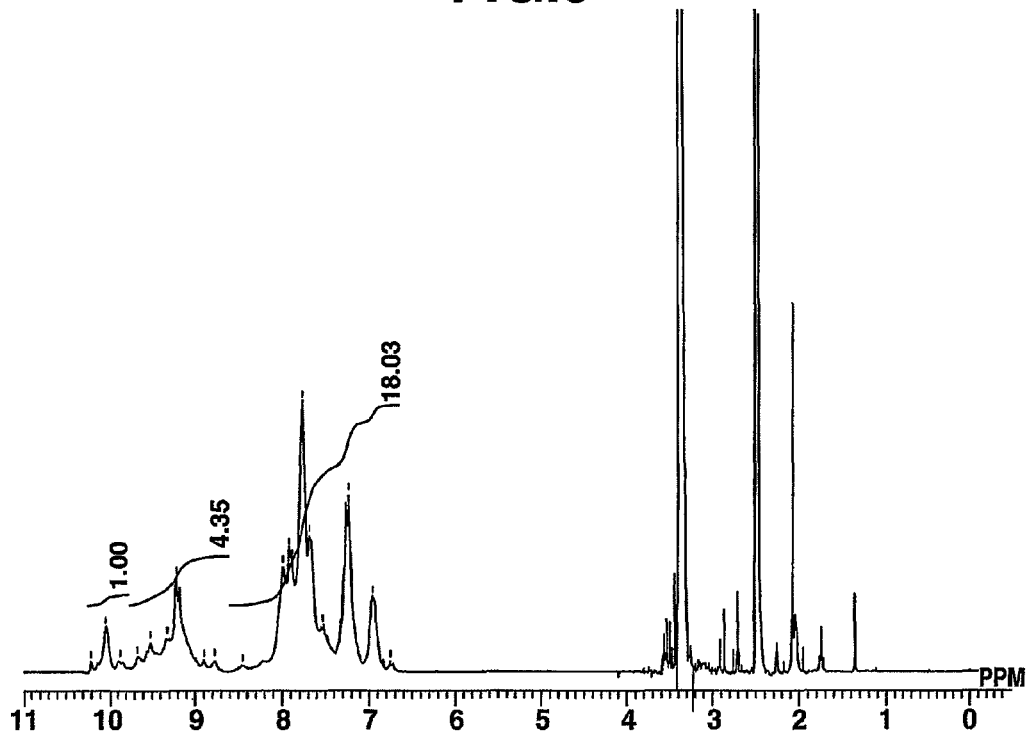
Figure 10:
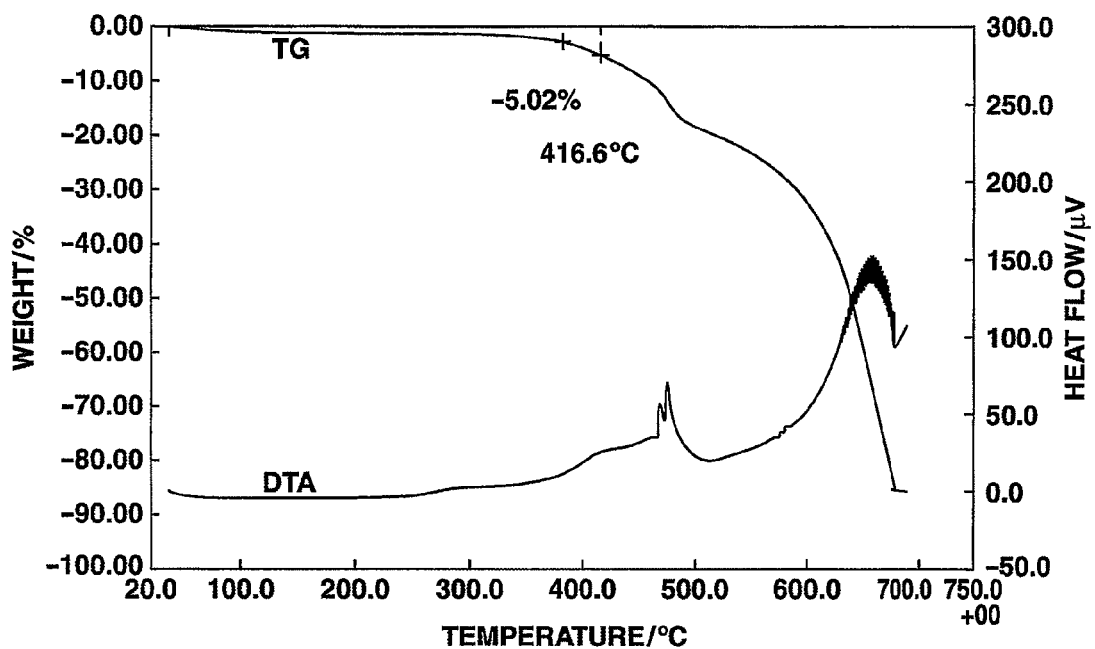
Figure 11:
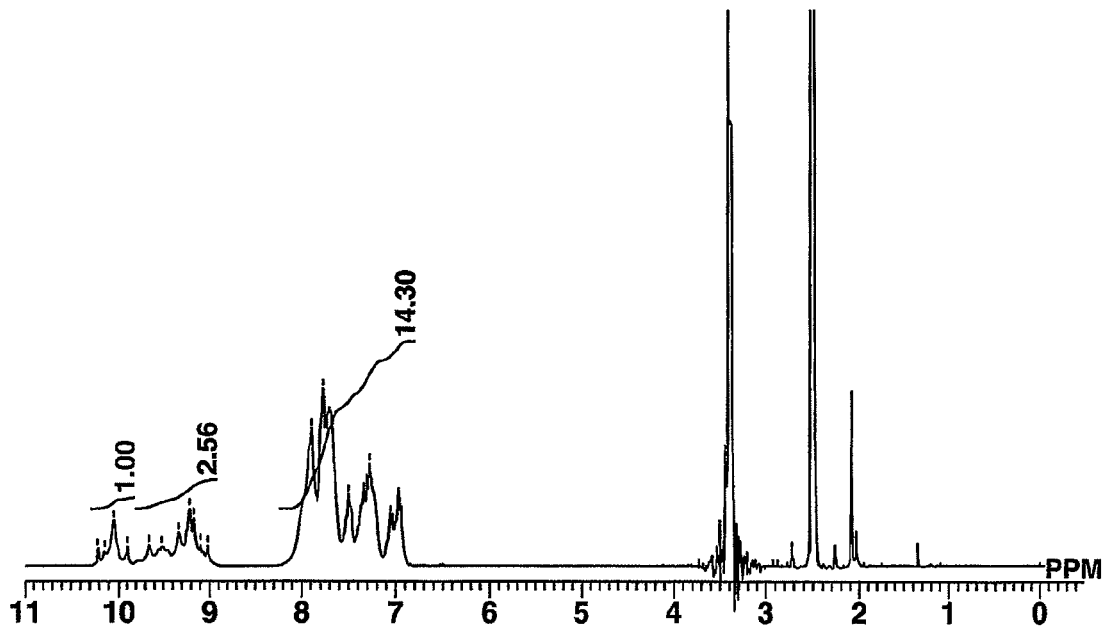
Figure 12:
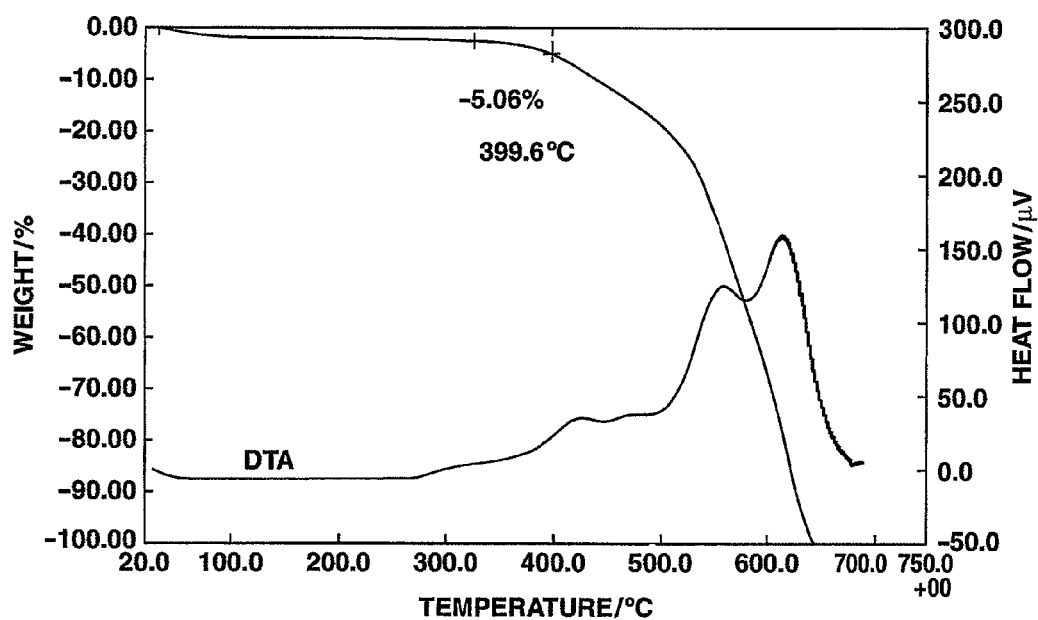
Figure 13:
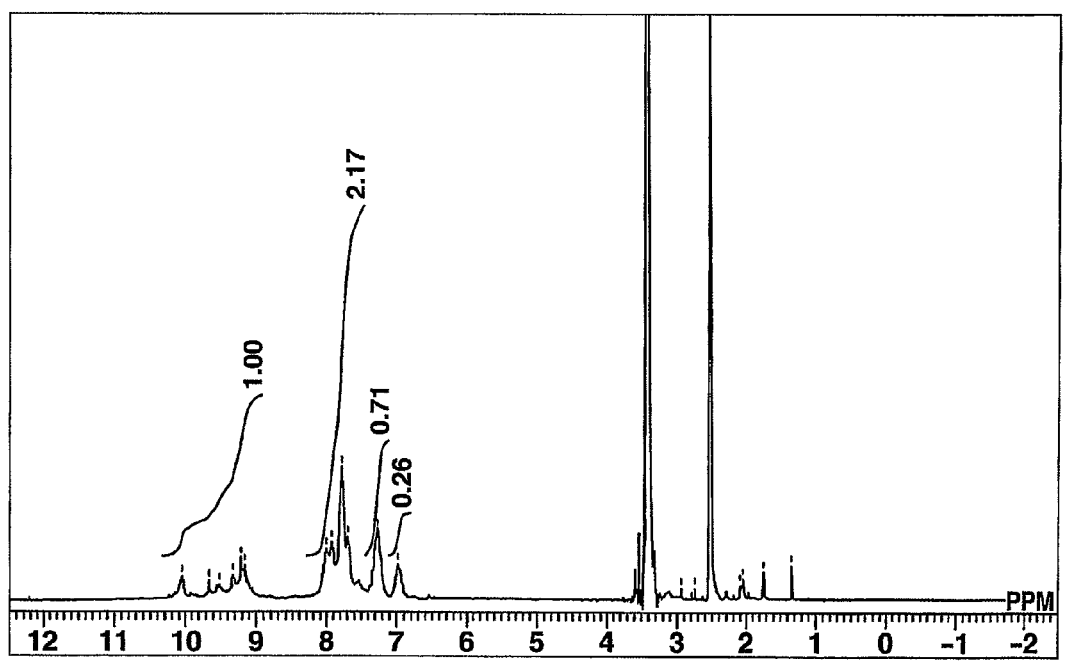
Figure 14:
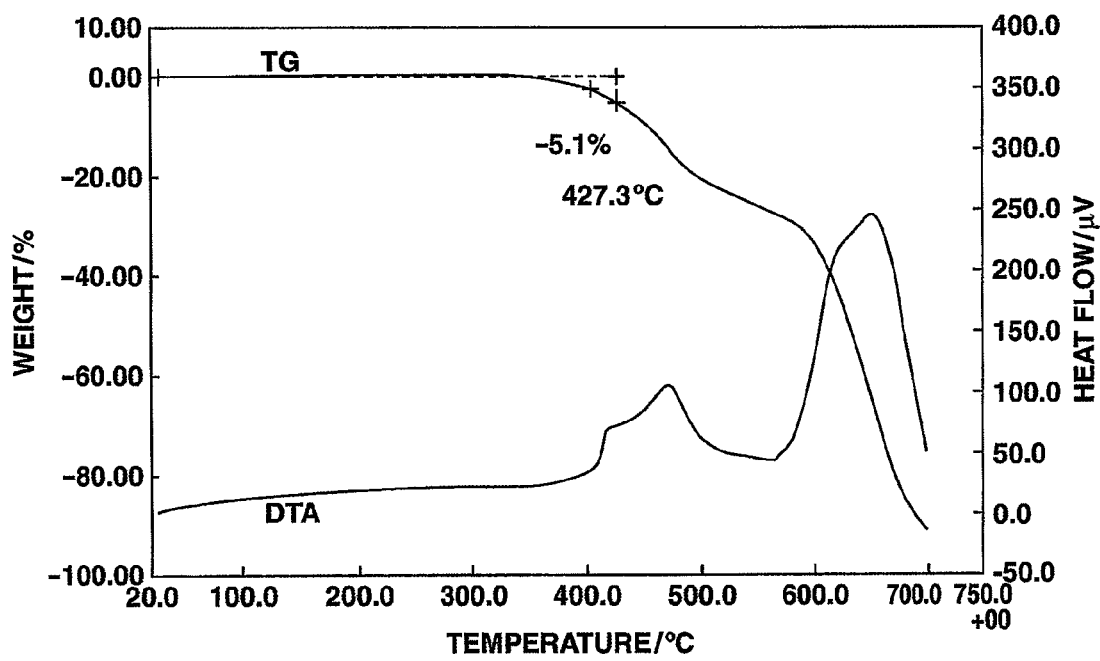

FIG. 1 is an $^1$H-NMR spectrum of the polymeric compound [4] obtained in Example 1.
FIG. 2 shows the TG-DTA results in Example 2.
FIG. 3 is an $^1$H-NMR spectrum of the polymeric compound [4] obtained in Example 4.
FIG. 4 shows the TG-DTA results in Example 5.
FIG. 5 is an $^1$H-NMR spectrum of the polymeric compound [4] obtained in Example 7.
FIG. 6 shows the TG-DTA results in Example 8.
FIG. 7 is an $^1$H-NMR spectrum of the polymeric compound [4] obtained in Example 10.
FIG. 8 shows the TG-DTA results in Example 11.
FIG. 9 is an $^1$H-NMR spectrum of the polymeric compound [6] obtained in Example 17.
FIG. 10 shows the TG-DTA results in Example 18.
FIG. 11 is an $^1$H-NMR spectrum of the polymeric compound [7] obtained in Example 20.
FIG. 12 shows the TG-DTA results in Example 21.
FIG. 13 is an $^1$H-NMR spectrum of the polymeric compound [6] obtained in Example 22.
FIG. 14 shows the TG-DTA results in Example 24.

EMBODIMENT FOR CARRYING OUT THE INVENTION

The invention is described more fully below.

The triazine ring-containing polymer according to the present invention includes a recurring unit structure of formula (1) below.

[Chemical Formula 8]

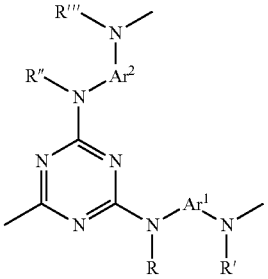

(1)

In the above formula, R, R', R" and R'" are each independently a hydrogen atom, an alkyl group, an alkoxy group, an aryl group or an aralkyl group.

In the invention, the number of carbons on the alkyl group, although not particularly limited, is preferably from 1 to 20. To further increase the heat resistance of the polymer, the number of carbons is more preferably from 1 to 10, and even more preferably from 1 to 3. The alkyl group may have a linear, branched or cyclic structure.

Illustrative examples of alkyl groups include methyl, ethyl, n-propyl, isopropyl, cyclopropyl, n-butyl, isobutyl, s-butyl, t-butyl, cyclobutyl, 1-methylcyclopropyl, 2-methylcyclopropyl, n-pentyl, 1-methyl-n-butyl, 2-methyl-n-butyl, 3-methyl-n-butyl, 1,1-dimethyl-n-propyl, 1,2-dimethyl-n-propyl, 2,2-dimethyl-n-propyl, 1-ethyl-n-propyl, cyclopentyl, 1-methylcyclobutyl, 2-methylcyclobutyl, 3-methylcyclobutyl, 1,2-dimethylcyclopropyl, 2,3-dimethylcyclopropyl, 1-ethylcyclopropyl, 2-ethylcyclopropyl, n-hexyl, 1-methyl-n-pentyl, 2-methyl-n-pentyl, 3-methyl-n-pentyl, 4-methyl-n-pentyl, 1,1-dimethyl-n-butyl, 1,2-dimethyl-n-butyl, 1,3-dimethyl-n-butyl, 2,2-dimethyl-n-butyl, 2,3-dimethyl-n-butyl, 3,3-dimethyl-n-butyl, 1-ethyl-n-butyl, 2-ethyl-n-butyl, 1,1,2-trimethyl-n-propyl, 1,2,2-trimethyl-n-propyl, 1-ethyl-1-methyl-n-propyl, 1-ethyl-2-methyl-n-propyl, cyclohexyl, 1-methylcyclopentyl, 2-methylcyclopentyl, 3-methylcyclopentyl, 1-ethylcyclobutyl, 2-ethylcyclobutyl, 3-ethylcyclobutyl, 1,2-dimethylcyclobutyl, 1,3-dimethylcyclobutyl, 2,2-dimethylcyclobutyl, 2,3-dimethylcyclobutyl, 2,4-dimethylcyclobutyl, 3,3-dimethylcyclobutyl, 1-n-propylcyclopropyl, 2-n-propylcyclopropyl, 1-isopropylcyclopropyl, 2-isopropylcyclopropyl, 1,2,2-trimethylcyclopropyl, 1,2,3-trimethylcyclopropyl, 2,2,3-trimethylcyclopropyl, 1-ethyl-2-methylcyclopropyl, 2-ethyl-1-methylcyclopropyl, 2-ethyl-2-methylcyclopropyl and 2-ethyl-3-methylcyclopropyl.

The number of carbons on the alkoxy group, although not particularly limited, is preferably from 1 to 20. To further increase the heat resistance of the polymer, the number of carbons is more preferably from 1 to 10, and even more preferably from 1 to 3. The alkyl moiety thereon may have a linear, branched or cyclic structure.

Illustrative examples of alkoxy groups include methoxy, ethoxy, n-propoxy, isopropoxy, n-butoxy, isobutoxy, s-butoxy, t-butoxy, n-pentoxy, 1-methyl-n-butoxy, 2-methyl-n-butoxy, 3-methyl-n-butoxy, 1,1-dimethyl-n-propoxy, 1,2-dimethyl-n-propoxy, 2,2-dimethyl-n-propoxy, 1-ethyl-n-propoxy, n-hexyloxy, 1-methyl-n-pentyloxy, 2-methyl-n-pentyloxy, 3-methyl-n-pentyloxy, 4-methyl-n-pentyloxy, 1,1-dimethyl-n-butoxy, 1,2-dimethyl-n-butoxy, 1,3-dimethyl-n-butoxy, 2,2-dimethyl-n-butoxy, 2,3-dimethyl-n-butoxy, 3,3-dimethyl-n-butoxy, 1-ethyl-n-butoxy, 2-ethyl-n-butoxy, 1,1,2-trimethyl-n-propoxy, 1,2,2-trimethyl-n-propoxy, 1-ethyl-1-methyl-n-propoxy and 1-ethyl-2-methyl-n-propoxy.

The number of carbons on the aryl group, although not particularly limited, is preferably from 6 to 40. To further increase the heat resistance of the polymer, the number of carbons is more preferably from 6 to 16, and even more preferably from 6 to 13.

Illustrative examples of aryl groups include phenyl, o-chlorophenyl, m-chlorophenyl, p-chlorophenyl, o-fluorophenyl, p-fluorophenyl, o-methoxyphenyl, p-methoxyphenyl, p-nitrophenyl, p-cyanophenyl, α-naphthyl, β-naphthyl, o-biphenylyl, m-biphenylyl, p-biphenylyl, 1-anthryl, 2-anthryl, 9-anthryl, 1-phenanthryl, 2-phenanthryl, 3-phenanthryl, 4-phenanthryl and 9-phenanthryl.

The number of carbons on the aralkyl group, although not particularly limited, is preferably from 7 to 20. The alkyl moiety thereon may be linear, branched or cyclic.

Illustrative examples of aralkyl groups include benzyl, p-methylphenylmethyl, m-methylphenylmethyl, o-ethylphenylmethyl, m-ethylphenylmethyl, p-ethylphenylmethyl, 2-propylphenylmethyl, 4-isopropylphenylmethyl, 4-isobutylphenylmethyl and α-naphthylmethyl.

$Ar^1$ and $Ar^2$ are each independently at least one selected from the group consisting of formulas (2) to (18) below. As the combination thereof, in particular, two of formulas (5) to (18) are preferred, two selected from the group consisting of formulas (5) to (12) and formulas (14) to (18) are more preferred, and two selected from the group consisting of formulas (7), (11), (12), (14) and (15) are even more preferred.

[Chemical Formula 9]

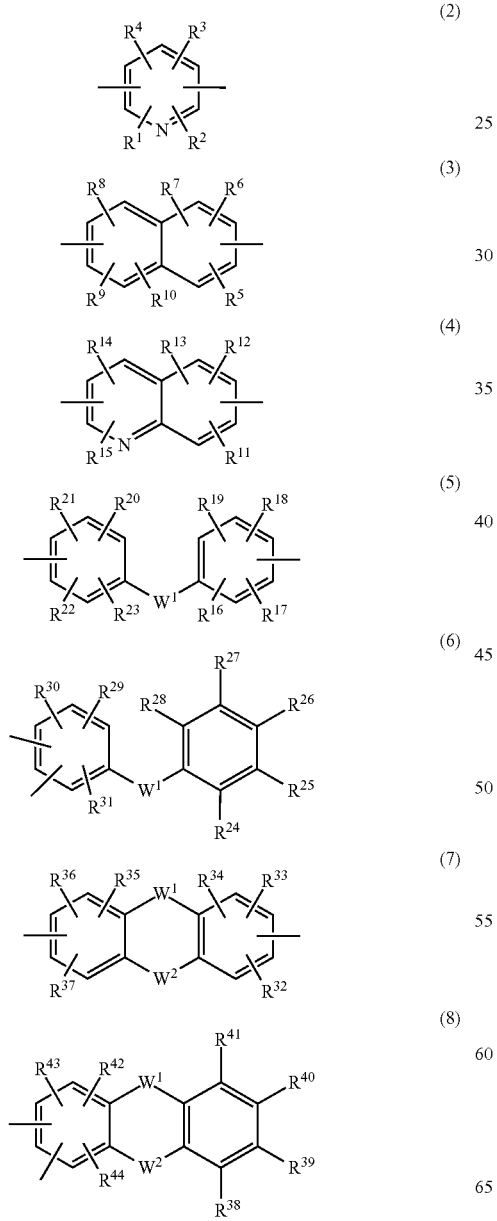

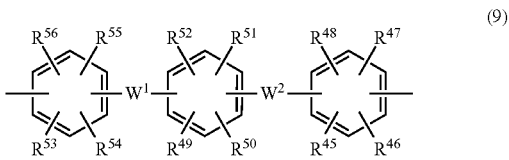

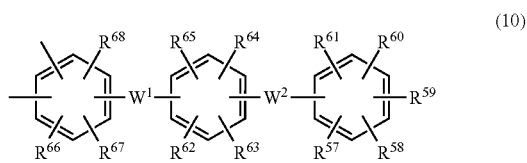

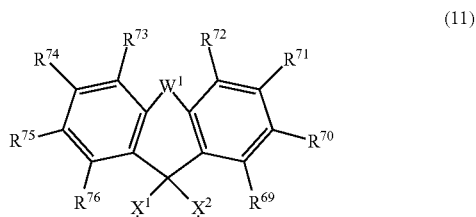

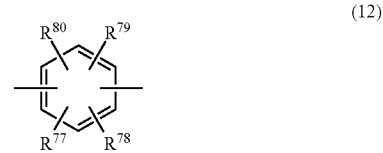

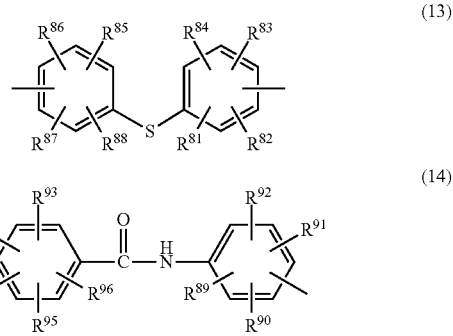

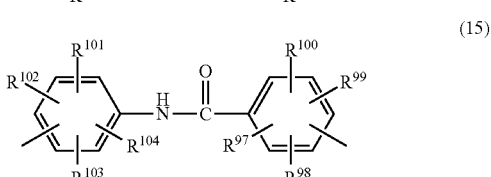

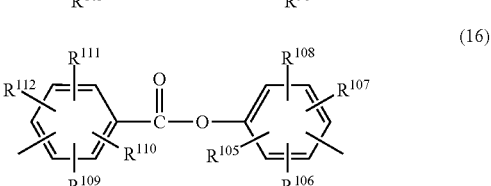

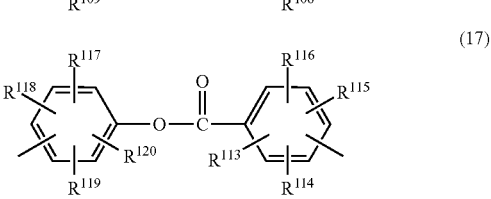

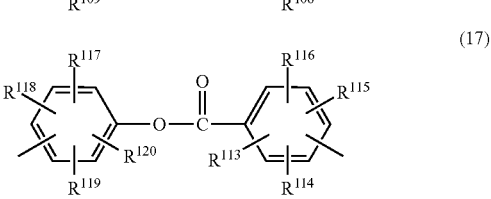

-continued (18)

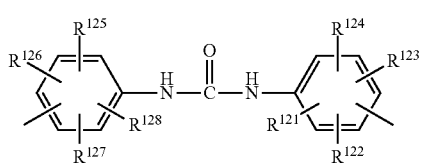

In the above formulas, $R^1$ to $R^{128}$ are each independently a hydrogen atom, a halogen atom, a carboxyl group, a sulfonyl group, an alkyl group which may have a branched structure of 1 to 10 carbons, or an alkoxy group which may have a branched structure of 1 to 10 carbons. $W^1$ and $W^2$ are each independently a single bond, $CR^{129}R^{130}$ (wherein $R^{129}$ and $R^{130}$ are each independently a hydrogen atom or an alkyl group which may have a branched structure of 1 to 10 carbons, with the proviso that $R^{129}$ and $R^{130}$ may together form a ring), C=O, O, S, SO, $SO_2$ or $NR^{131}$ (wherein $R^{131}$ is a hydrogen atom or an alkyl group which may have a branched structure of 1 to 10 carbons).

These alkyl groups and alkoxy groups are exemplified by the same groups as mentioned above.

Examples of the halogen atom include fluorine, chlorine, bromine and iodine.

$X^1$ and $X^2$ are each independently a single bond, an alkylene group which may have a branched structure of 1 to 10 carbons, or a group of formula (19) below.

[Chemical Formula 10]

(19)

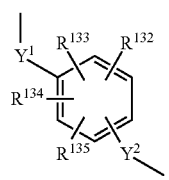

In the above formula, $R^{132}$ to $R^{135}$ are each independently a hydrogen atom, a halogen atom, a carboxyl group, a sulfonyl group, an alkyl group which may have a branched structure of 1 to 10 carbons, or an alkoxy structure which may have a branched structure of 1 to 10 carbons. $Y^1$ and $Y^2$ are each independently a single bond or an alkylene group which may have a branched structure of 1 to 10 carbons.

These halogen atoms, alkyl groups and alkoxy groups are exemplified by the same groups as mentioned above.

Illustrative examples of the alkylene group which may have a branched structure of 1 to 10 carbons include methylene, ethylene, propylene, trimethylene, tetramethylene and pentamethylene.

Illustrative examples of the aryl groups of above formulas (2) to (18) include, but are not limited to, the following.

[Chemical Formula 11]

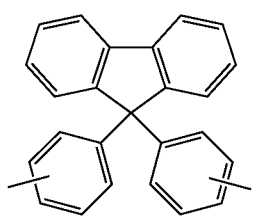

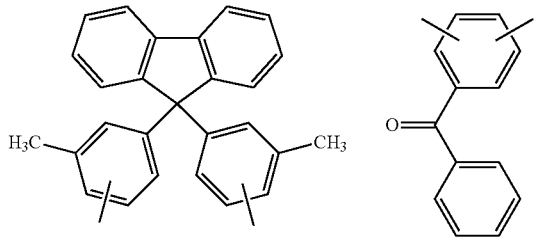

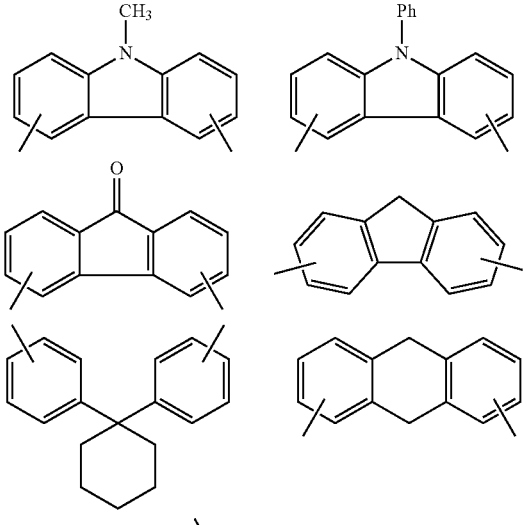

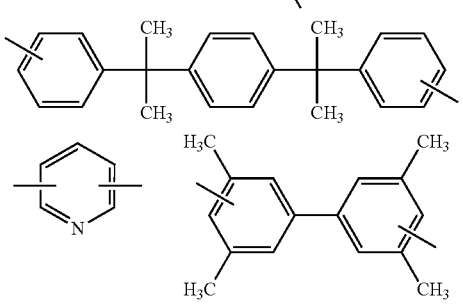

-continued

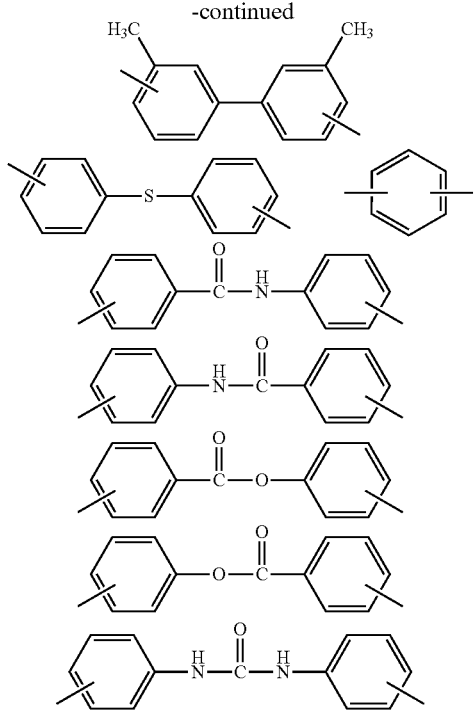

Of these, to obtain a polymer having a higher refractive index, the aryl groups of the following formulas are more preferred.

[Chemical Formula 12]

-continued

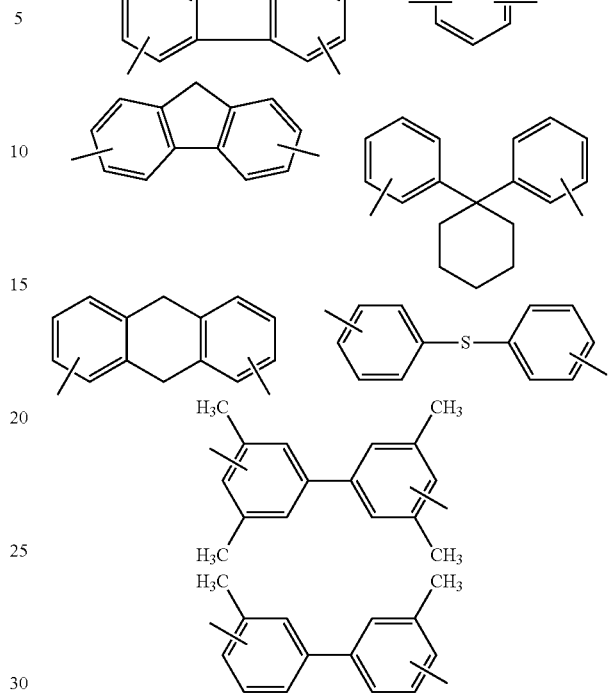

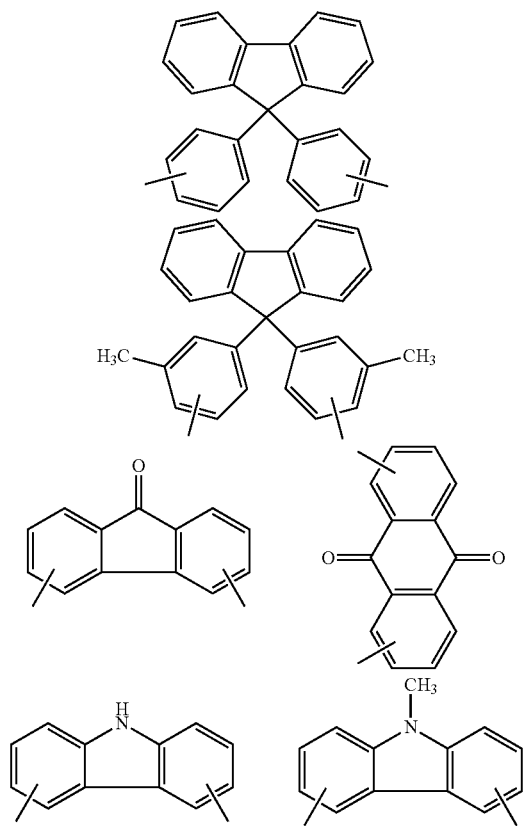

Moreover, from the standpoint of achieving a high refractive index, aryl moieties ($Ar^1$ and/or $Ar^2$ moieties, the same applies below) with a rigid structure having a cyclic skeleton such as a fluorene skeleton or a carbazole skeleton are preferable because the aryl moieties tend to cluster together, increasing the electron density. Alternatively, a simple benzene ring is also preferable because, being small structures, aryl moieties tend to cluster together, increasing the electron density.

As for benzene ring linkages such as $W^1$, functional groups having a high hydrogen bonding ability, such as carbonyl-containing groups and amines, are preferred because these form hydrogen bonds with hydrogen atoms amine sites (in cases where R, R', R" and/or R'" are hydrogen atoms), as a result of which the aryl moieties tend to cluster together, increasing the electron density.

From the above standpoint, aryl groups of the following formulas are preferred.

[Chemical Formula 13]

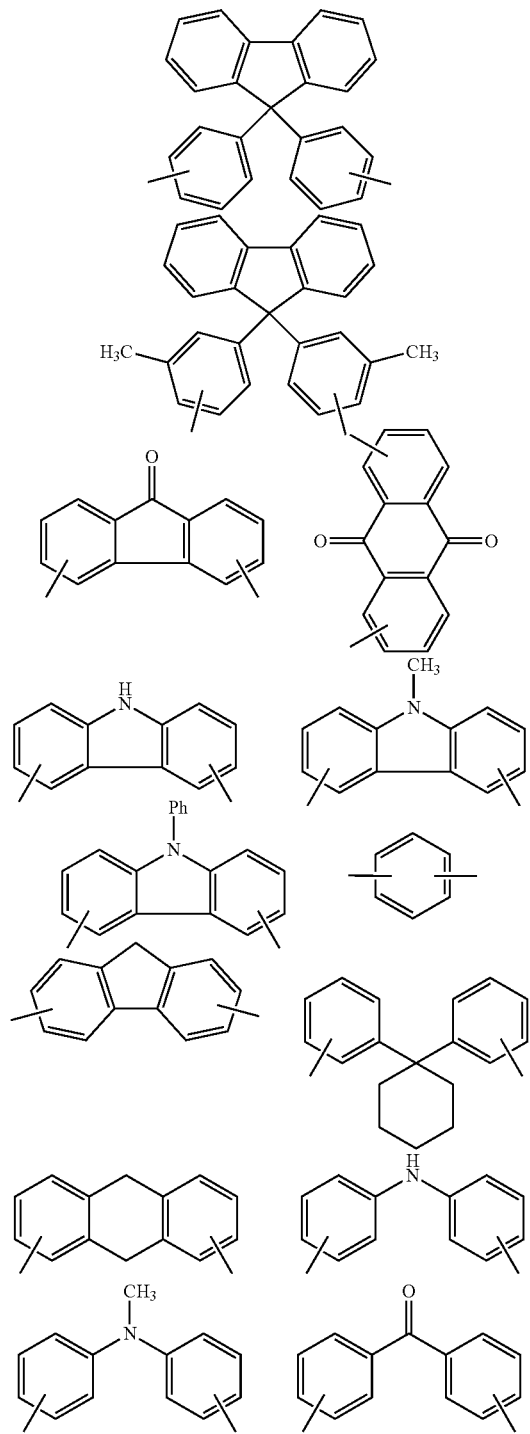

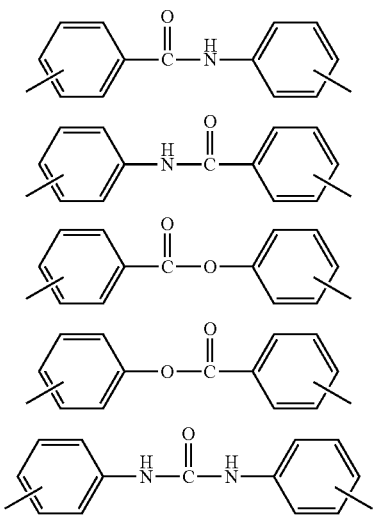

To achieve an even higher refractive index, aryl groups of the following formulas are more preferred.

[Chemical Formula 14]

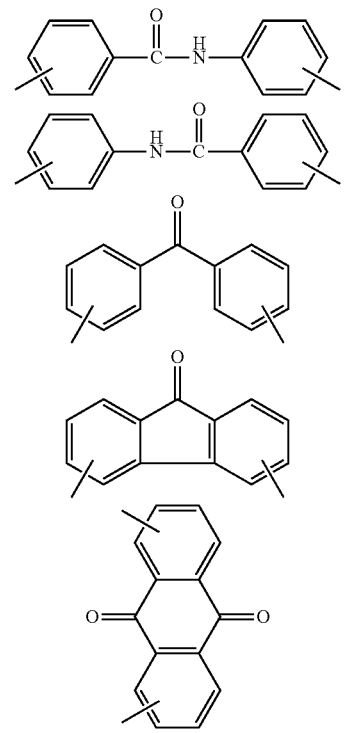

To further increase the solubility of the hyperbranched polymer in highly safe solvents such as resist solvents, a group from an m-phenylenediamine derivative is preferred as the aryl group.

Taking into account, for example, the properties of substituents such as those mentioned above and their ready availability, two selected from among those of formulas (20) to (24) below are the preferred combination of $Ar^1$ and $Ar^2$ in this invention.

[Chemical Formula 15]

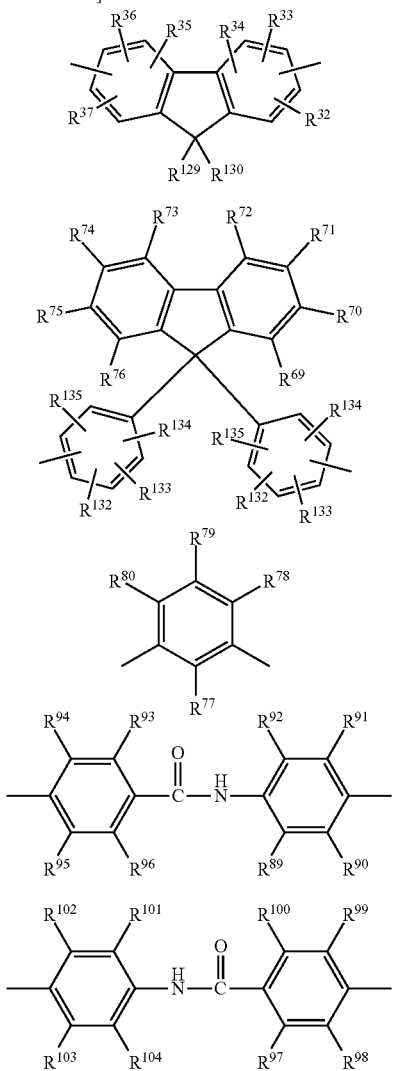

(20)
(21)
(22)
(23)
(24)

Here, $R^{32}$ to $R^{37}$, $R^{69}$ to $R^{80}$, $R^{89}$ to $R^{104}$, $R^{129}$, $R^{130}$ and $R^{132}$ to $R^{135}$ are as defined above, but are all preferably hydrogen atoms.

In this invention, examples of preferred recurring unit structures include, but are not limited to, those of the following formulas (25) to (27).

[Chemical Formula 16]

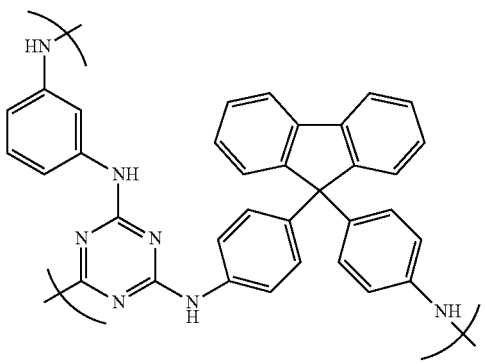

(25)

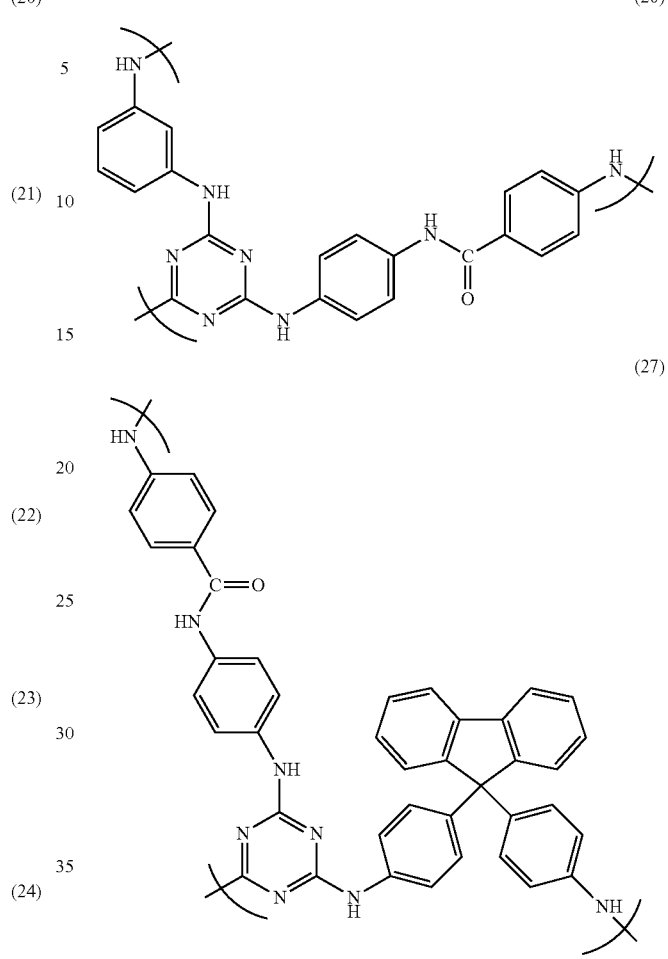

(26)
(27)

The triazine ring-containing hyperbranched polymer of the invention has a weight-average molecular weight which, although not particularly limited, is preferably between 500 and 500,000, and more preferably between 500 and 100,000. To further enhance the heat resistance and lower the shrinkage ratio, the weight-average molecular weight is preferably at least 2,000. To further increase the solubility and lower the viscosity of the resulting solution, the weight-average molecular weight is preferably 50,000 or less, more preferably 30,000 or less, and even more preferably 10,000 or less.

The weight-average molecular weight in the invention is the weight-average molecular weight measured by gel permeation chromatography (GPC) against a polystyrene standard.

Exemplary methods for preparing the triazine ring-containing polymer (hyperbranched polymer) of the invention are described.

The copolymeric triazine ring-containing polymer of the invention can be obtained by reacting a cyanuric halide with at least two diaminoaryl compounds. For example, as shown in Scheme 1 below, a hyperbranched polymer having the recurring structure (25') can be obtained by reacting a cyanuric halide (28) with a bisaminophenylfluorene compound (29) and an m-phenylenediamine compound (30) in a suitable organic solvent.

Scheme 1

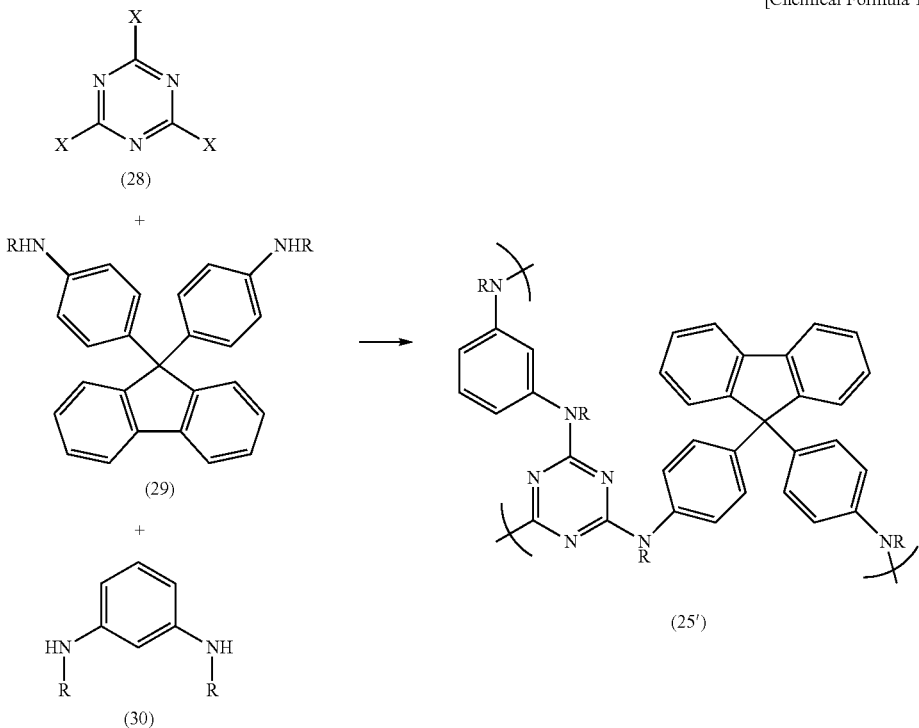

In the above formulas, each occurrence of X is independently a halogen atom; and R is as defined above.

Alternatively, as shown in Scheme 2 below, a hyperbranched polymer having the recurring structure (25') can be synthesized from a compound (31) obtained by reacting equimolar amounts of a cyanuric halide (28) and a bisaminophenylfluorene compound (29) in a suitable organic solvent, and a compound (32) obtained by reacting equimolar amounts of a cyanuric halide (28) and an m-phenylenediamine compound (30) in a suitable organic solvent.

Scheme 2

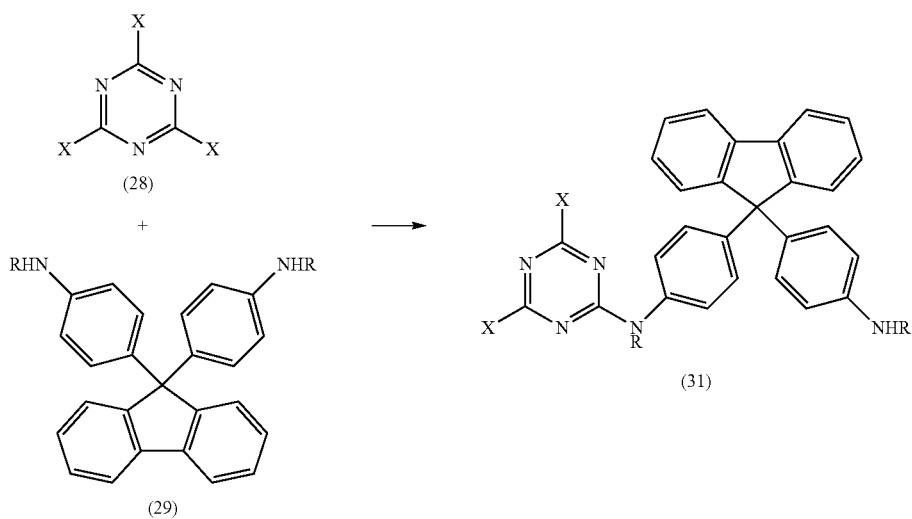

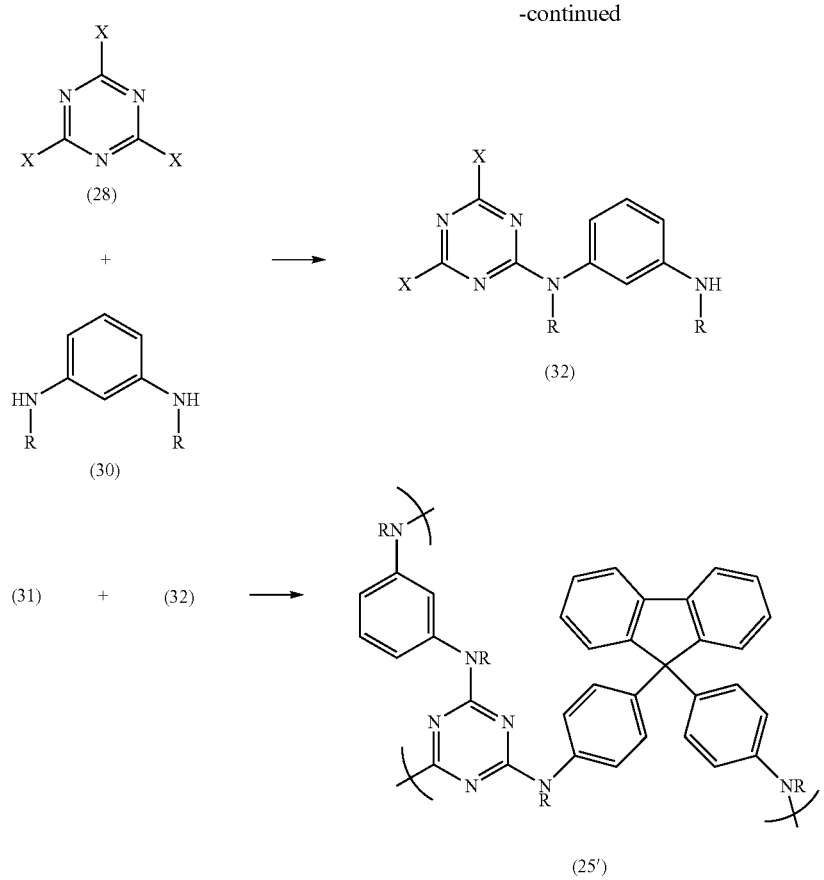

In the above formulas, each occurrence of X is independently a halogen atom; and R is as defined above.

By using the above methods, the hyperbranched polymer of the invention can be easily and safely produced at a low cost. Because the reaction time in these methods is much shorter than in the synthesis of ordinary polymers, these production methods are compatible with recent concerns for the environment and are capable of reducing $CO_2$ emissions. Moreover, such methods can carry out stable production even when the scale of production is greatly expanded, and thus allow a stable supply system to be maintained even at an industrial level.

In the method of above Scheme 1, the respective starting materials may be charged in any suitable amounts so long as the target polymer is obtained. However, the use of the m-phenylenediamine compound (30) and the bisaminophenylfluorene compound (29) in a combined amount of from 0.01 to 10 equivalents per equivalent of the cyanuric halide (28) is preferred, but it is preferable to avoid using the m-phenylenediamine compound (30) and the bisaminophenylfluorene compound (29) in a combined amount of 3 equivalents per 2 equivalents of the cyanuric halide (28). By having the number of equivalents of the respective functional groups differ from this ratio, the formation of a gel can be prevented.

To obtain terminal triazine ring-containing highly branched polymers (hyperbranched polymers) of various molecular weights, it is preferable to use the m-phenylenediamine compound (30) and the bisaminophenylfluorene compound (29) in a combined amount of less than 3 equivalents per 2 equivalents of the cyanuric halide (28).

On the other hand, to obtain terminal amine-containing highly branched polymers (hyperbranched polymers) of various molecular weights, it is preferable to use the cyanuric halide (28) in an amount of less than 2 equivalents per 3 equivalents of the combined amount of the m-phenylenediamine compound (30) and the bisaminophenylfluorene compound (29).

By suitably regulating the amounts of the m-phenylenediamine compound (30) and the bisaminophenylfluorene compound (29) and the amount of the cyanuric halide (28) in this way, the molecular weight of the resulting highly branched polymer (hyperbranched polymer) can easily be regulated.

In the case of the method of Scheme 2, the respective starting materials may be charged in any amount, so long as the target hyperbranched polymer is obtained, although it is preferable for each of the diamino compounds (29) and (30) to be charged in an amount of from 0.01 to 10 equivalents per equivalent of the cyanuric halide (28).

Various solvents that are commonly used in this type of reaction may be used as the organic solvent. Illustrative examples include tetrahydrofuran, dioxane, dimethylsulfoxide; amide solvents such as N,N-dimethylformamide, N-methyl-2-pryrrolidone, tetramethylurea, hexamethylphosphoramide, N,N-dimethylacetamide, N-methyl-2-piperidone, N,N-dimethylethyleneurea, N,N,N',N'-tetramethylmalonamide, N-methylcaprolactam, N-acetylpyrrolidine, N,N-diethylacetamide, N-ethyl-2-pyrrolidone, N,N-dimethylpropionamide, N,N-dimethylisobutyramide, N-methylformamide and N,N'-dimethylpropyleneurea; and mixed solvents thereof.

Of the above, N,N-dimethylformamide, dimethylsulfoxide, N-methyl-2-pyrrolidone, N,N-dimethylacetamide and mixed solvents thereof are preferred. N,N-Dimethylacetamide and N-methyl-2-pyrrolidone are especially preferred.

In the Scheme 1 reaction and the second stage (recurring structure (25')-containing hyperbranched polymer synthesis stage) reaction in Scheme 2, the reaction temperature may be suitably set in the range from the melting point of the solvent used to the boiling point of the solvent, although the temperature is preferably from about 0° C. to about 150° C., and more preferably from 60 to 100° C.

In the Scheme 1 reaction in particular, to suppress linearity and increase the degree of branching, the reaction temperature is preferably from 60 to 150° C., more preferably from 80 to 150° C., and even more preferably from 80 to 120° C.

In the first-stage (Compounds (31) and (32) synthesis stage) reactions of Scheme 2, the reaction temperature may be suitably set in the range from the melting point of the solvent used to the boiling point of the solvent, with a temperature of from about −50 to about 50° C. being preferred, a temperature of from about −20 to about 50° C. being more preferred, a temperature of from about −10 to about 50° C. being even more preferred, and a temperature of from −10 to 10° C. being still more preferred.

In the first-stage reactions of the Scheme 2 method in particular, the use of a two-step process consisting of a first step involving reaction at from −50 to 50° C. followed by a second step involving reaction at from 60 to 150° C. is preferred.

In each of the above reactions, the ingredients may be added in any order. However, in the Scheme 1 reaction, the best method is to heat a solution containing either the cyanuric halide (28) or the diamino compound (29), (30) and the organic solvent to a temperature of from 60 to 150° C., and preferably from 80 to 150° C., then add the remaining ingredient—the diamino compound (29), (30) or the cyanuric halide (28)—to the resulting solution at this temperature.

In this case, either ingredient may be used as the ingredient which is initially dissolved in the solvent or as the ingredient which is subsequently added, although a method wherein the cyanuric halide (28) is added to a heated solution of the diamino compound (29), (30) is preferred.

In the Scheme 2 reactions, either ingredient may be used as the ingredient which is initially dissolved in the solvent or as the ingredient which is subsequently added, although a method wherein the diamino compound (29), (30) is added to a cooled solution of the cyanuric halide (28) is preferred.

The subsequently added ingredient may be added neat or may be added as a solution of the ingredient dissolved in an organic solvent such as any of those mentioned above. However, taking into account the ease of the operations and the controllability of the reaction, the latter approach is preferred.

Also, addition may be carried out gradually such as in a dropwise manner, or the entire amount may be added all at once in a batchwise manner.

In Scheme 1, even in cases where the reaction is carried out in a single stage (without raising the temperature in a stepwise fashion), in a heated state and after both compounds have been mixed, the desired copolymeric triazine ring-containing hyperbranched polymer can be obtained without gelation.

In the Scheme 1 reaction and the second stage reaction in Scheme 2, various bases which are commonly used during or after polymerization may be added.

Illustrative examples of such bases include potassium carbonate, potassium hydroxide, sodium carbonate, sodium hydroxide, sodium bicarbonate, sodium ethoxide, sodium acetate, lithium carbonate, lithium hydroxide, lithium oxide, potassium acetate, magnesium oxide, calcium oxide, barium hydroxide, trilithium phosphate, trisodium phosphate, tripotassium phosphate, cesium fluoride, aluminum oxide, ammonia, trimethylamine, triethylamine, diisopropylmethylamine, diisopropylethylamine, N-methylpiperidine, 2,2,6,6-tetramethyl-N-methylpiperidine, pyridine, 4-dimethylaminopyridine and N-methylmorpholine.

The amount of base added per equivalent of the cyanuric halide (28) is preferably from 1 to 100 equivalents, and more preferably from 1 to 10 equivalents. These bases may also be used in the form of an aqueous solution.

Although it is preferable for no starting ingredients to remain in the resulting polymer, some starting material may remain, provided this does not interfere with the advantageous effects of the invention.

In the methods of both schemes, following reaction completion, the product can be easily purified by a suitable technique such as reprecipitation.

Also, in the present invention, some portion of the halogen atoms on at least one terminal triazine ring may be capped by, for example, an alkyl, aralkyl, aryl, alkylamino, alkoxysilyl-containing alkylamino, aralkylamino, arylamino, alkoxy, aralkyloxy, aryloxy or ester group.

Of these, alkylamino, alkoxysilyl-containing alkylamino, aralkylamino and arylamino groups are preferred. Alkylamino and arylamino groups are more preferred. Arylamino groups are even more preferred.

Illustrative examples of ester groups include methoxycarbonyl and ethoxycarbonyl.

Illustrative examples of alkylamino groups include methylamino, ethylamino, n-propylamino, isopropylamino, n-butylamino, isobutylamino, s-butylamino, t-butylamino, n-pentylamino, 1-methyl-n-butylamino, 2-methyl-n-butylamino, 3-methyl-n-butylamino, 1,1-dimethyl-n-propylamino, 1,2-dimethyl-n-propylamino, 2,2-dimethyl-n-propylamino, 1-ethyl-n-propylamino, n-hexylamino, 1-methyl-n-pentylamino, 2-methyl-n-pentylamino, 3-methyl-n-pentylamino, 4-methyl-n-pentylamino, 1,1-dimethyl-n-butylamino, 1,2-dimethyl-n-butylamino, 1,3-dimethyl-n-butylamino, 2,2-dimethyl-n-butylamino, 2,3-dimethyl-n-butylamino, 3,3-dimethyl-n-butylamino, 1-ethyl-n-butylamino, 2-ethyl-n-butylamino, 1,1,2-trimethyl-n-propylamino, 1,2,2-trimethyl-n-propylamino, 1-ethyl-1-methyl-n-propylamino and 1-ethyl-2-methyl-n-propylamino.

Illustrative examples of aralkylamino groups include benzylamino, methoxycarbonylphenylmethylamino, ethoxycarbonylphenylmethylamino, p-methylphenylmethylamino, m-methylphenylmethylamino, o-ethylphenylmethylamino, m-ethylphenylmethylamino, p-ethylphenylmethylamino, 2-propylphenylmethylamino, 4-isopropylphenylmethylamino, 4-isobutylphenylmethylamino, naphthylmethylamino, methoxycarbonylnaphthylmethylamino and ethoxycarbonylnaphthylmethylamino.

Illustrative examples of arylamino groups include phenylamino, methoxycarbonylphenylamino, ethoxycarbonylphenylamino, naphthylamino, methoxycarbonylnaphthylamino, ethoxycarbonylnaphthylamino, anthranylamino, pyrenylamino, biphenylamino, terphenylamino and fluorenylamino.

Alkoxysilyl-containing alkylamino groups are exemplified by monoalkoxysilyl-containing alkylamino groups, dialkoxysilyl-containing alkylamino groups and trialkoxysilyl-containing alkylamino groups. Illustrative examples include 3-trimethoxysilylpropylamino, 3-triethoxysilylpropylamino, 3-dimethylethoxysilylpropylamino, 3-methyldiethoxysilylpropylamino, N-(2-aminoethyl)-3-dimethylmethoxysilylpropylamino, N-(2-aminoethyl)-3-methyldimethoxysilylpropylamino and N-(2-aminoethyl)-3-trimethoxysilylpropylamino.

Illustrative examples of aryloxy groups include phenoxy, naphthoxy, anthranyloxy, pyrenyloxy, biphenyloxy, terphenyloxy and fluorenyloxy.

Illustrative examples of aralkyloxy groups include benzyloxy, p-methylphenylmethyloxy, m-methylphenylmethyloxy, o-ethylphenylmethyloxy, m-ethylphenylmethyloxy, p-ethylphenylmethyloxy, 2-propylphenylmethyloxy, 4-isopropylphenylmethyloxy, 4-isobutylphenylmethyloxy and α-naphthylmethyloxy.

In addition, alkyl groups, aralkyl groups and aryl groups are exemplified in the same way as described earlier in the specification.

These groups can be easily introduced by substituting a halogen atom on a triazine ring with a compound that furnishes the corresponding substituent. For example, as shown in Scheme 3 below, by adding an aniline derivative and inducing a reaction, a hyperbranched polymer (33) having a phenylamino group on at least one chain end is obtained.

Because the hyperbranched polymer obtained in this way has an excellent solubility in a solvent (meaning that aggregation is inhibited) and has an excellent crosslinkability with a crosslinking agent, it is especially advantageous when used as a composition in combination with the subsequently described crosslinking agent.

An alkyl monoamine, aralkyl monoamine or aryl monoamine may be used here as the organic monoamine.

Illustrative examples of alkyl monoamines include methylamine, ethylamine, n-propylamine, isopropylamine, n-butylamine, isobutylamine, s-butylamine, t-butylamine, n-pentylamine, 1-methyl-n-butylamine, 2-methyl-n-butylamine, 3-methyl-n-butylamine, 1,1-dimethyl-n-propylamine, 1,2-dimethyl-n-propylamine, 2,2-dimethyl-n-propylamine, 1-ethyl-n-propylamine, n-hexylamine, 1-methyl-n-pentylamine, 2-methyl-n-pentylamine, 3-methyl-n-pentylamine, 4-methyl-n-pentylamine, cyclohexylamine, 1,1-dimethyl-n-butylamine, 1,2-dimethyl-n-butylamine, 1,3-dimethyl-n-butylamine, 2,2-dimethyl-n-butylamine, 2,3-dimethyl-n-butylamine, 3,3-dimethyl-n-butylamine, 1-ethyl-n-butylamine, 2-ethyl-n-butylamine, 1,1,2-trimethyl-n-propylamine, 1,2,2-trimethyl-n-propylamine, 1-ethyl-1-methyl-n-propylamine, 1-ethyl-2-methyl-n-propylamine and 2-ethylhexylamine.

Illustrative examples of aralkyl monoamines include benzylamine, p-methoxycarbonylbenzylamine, p-ethoxycarbo- Scheme 3

[Chemical Formula 19]

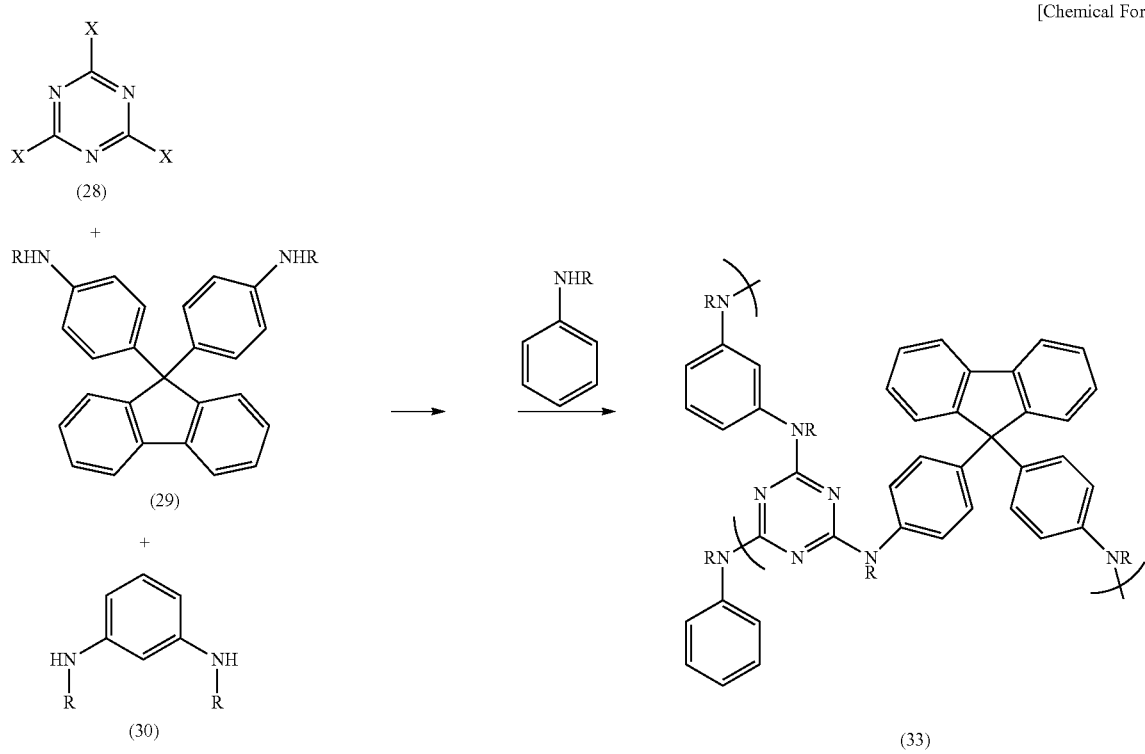

In these formulas, X and R are as defined above.

At this time, by reacting a cyanuric halide with a diaminoaryl compound while at the same time charging an organic monoamine, i.e., in the presence of an organic monoamine, it is possible to obtain a flexible hyperbranched polymer having a low degree of branching in which the rigidity of the hyperbranched polymer has been diminished.

nylbenzylamine, p-methylbenzylamine, m-methylbenzylamine and o-methoxybenzylamine.

Illustrative examples of aryl monoamines include aniline, p-methoxycarbonylaniline, p-ethoxycarbonylaniline, p-methoxyaniline, 1-naphthylamine, 2-naphthylamine, anthranylamine, 1-aminopyrene, 4-biphenylylamine, o-phenylaniline, 4-amino-p-terphenyl and 2-aminofluorene.

In this case, the amount of organic monoamine used per equivalent of the cyanuric halide is preferably from 0.05 to 500 equivalents, more preferably from 0.05 to 120 equivalents, and even more preferably from 0.05 to 50 equivalents.

To suppress linearity and increase the degree of branching, the reaction temperature in this case is preferably from 60 to 150° C., more preferably from 80 to 150° C., and even more preferably from 80 to 120° C.

However, mixing of the three ingredients—an organic monoamine, a cyanuric halide and a diaminoaryl compound—may be carried out at a low temperature, in which case the temperature is set to preferably from about −50° C. to about 50° C., more preferably from about −20° C. to about 50° C., and even more preferably from about −20° C. to about 10° C. Following low-temperature charging, it is preferable to raise the temperature without interruption (in a single step) to the polymerization temperature and carry out the reaction.

Alternatively, the mixing of two ingredients—a cyanuric halide and a diaminoaryl compound—may be carried out at a low temperature, in which case the temperature is set to preferably from about −50° C. to about 50° C., more preferably from about −20° C. to about 50° C., and even more preferably from about −20° C. to about 10° C. Following low-temperature charging, it is preferable to add the organic monoamine and raise the temperature without interruption (in a single step) to the polymerization temperature and carry out the reaction.

The reaction of the cyanuric halide with the diaminoaryl compound in the presence of such an organic monoamine may be carried out using an organic solvent like those mentioned above.

The above-described polymer of the invention may be used as a composition obtained by admixture with other compounds, such as a composition that includes also a leveling agent, a surfactant, a crosslinking agent, a resin and the like.

Such compositions may be used as film-forming compositions, and may be preferably used as film-forming compositions dissolved in various solvents (also referred to as "polymer varnishes").

The solvent used for dissolving the polymer may be the same as or different from the solvent used during polymerization. This solvent is not subject to any particular limitation, provided there is no loss of compatibility with the polymer. It is possible to select and use, as desired, either a single solvent or a plurality of solvents.

Illustrative examples of such solvents include toluene, p-xylene, o-xylene, m-xylene, ethylbenzene, styrene, ethylene glycol dimethyl ether, propylene glycol monomethyl ether, ethylene glycol monomethyl ether, propylene glycol, propylene glycol monoethyl ether, ethylene glycol monoethyl ether, ethylene glycol monoisopropyl ether, ethylene glycol methyl ether acetate, propylene glycol monomethyl ether acetate, ethylene glycol ethyl ether acetate, diethylene glycol dimethyl ether, propylene glycol monobutyl ether, ethylene glycol monobutyl ether, diethylene glycol diethyl ether, dipropylene glycol monomethyl ether, diethylene glycol monomethyl ether, dipropylene glycol monoethyl ether, diethylene glycol monoethyl ether, triethylene glycol dimethyl ether, diethylene glycol monoethyl ether acetate, diethylene glycol, 1-octanol, ethylene glycol, hexylene glycol, trimethylene glycol, 1-methoxy-2-butanol, cyclohexanol, diacetone alcohol, furfuryl alcohol, tetrahydrofurfuryl alcohol, propylene glycol, benzyl alcohol, 1,3-butanediol, 1,4-butanediol, 2,3-butanediol, γ-butyrolactone, acetone, methyl ethyl ketone, methyl isopropyl ketone, diethyl ketone, methyl isobutyl ketone, methyl n-butyl ketone, cyclohexanone, ethyl acetate, isopropyl acetate, n-propyl acetate, isobutyl acetate, n-butyl acetate, ethyl lactate, methanol, ethanol, isopropanol, tert-butanol, allyl alcohol, n-propanol, 2-methyl-2-butanol, isobutanol, n-butanol, 2-methyl-1-butanol, 1-pentanol, 2-methyl-1-pentanol, 2-ethylhexanol, 1-methoxy-2-propanol, tetrahydrofuran, 1,4-dioxane, N,N-dimethylformamide, N,N-dimethylacetamide, N-methylpyrrolidone, 1,3-dimethyl-2-imidazolidinone, dimethylsulfoxide and N-cyclohexyl-2-pyrrolidinone. These may be used singly or two or more may be used in combination.

At this time, the solid content in the film-forming composition is not particularly limited, provided it is in a range that does not exert an influence on the storage stability, and may be suitably set in accordance with the intended thickness of the film. Specifically, from the standpoint of solubility and storage stability, the solid content is preferably from 0.1 to 50 wt %, and more preferably from 0.1 to 20 wt %.

Aside from a triazine ring-containing polymer and a solvent, the film-forming composition of the invention may include also other ingredients, such as a leveling agent, a surfactant and a crosslinking agent, provided this does not interfere with the advantageous effects of the invention.

Illustrative examples of surfactants include the following nonionic surfactants: polyoxyethylene alkyl ethers such as polyoxyethylene lauryl ether, polyoxyethylene stearyl ether, polyoxyethylene cetyl ether and polyoxyethylene oleyl ether; polyoxyethylene alkylaryl ethers such as polyoxyethylene octylphenol ether and polyoxyethylene nonylphenol ether; polyoxyethylene-polyoxypropylene block copolymers; sorbitan fatty acid esters such as sorbitan monolaurate, sorbitan monopalmitate, sorbitan monostearate, sorbitan monooleate, sorbitan trioleate and sorbitan tristearate; and polyoxyethylene sorbitan fatty acid esters such as polyoxyethylene sorbitan monolaurate, polyoxyethylene sorbitan monopalmitate, polyoxyethylene sorbitan monostearate, polyoxyethylene sorbitan trioleate and polyoxyethylene sorbitan tristearate; and additionally include fluorosurfactants such as those available under the trade names Eftop EF301, EF303 and EF352 (from Mitsubishi Materials Electronic Chemicals Co., Ltd. (formerly Jemco Inc.)), Megafac F171, F173, R-08, R-30, F-553 and F-554 (DIC Corporation), Fluorad FC430 and FC431 (Sumitomo 3M, Ltd.), Asahi-Guard AG710 and Surflon S-382, SC101, SC102, SC103, SC104, SC105 and SC106 (Asahi Glass Co., Ltd.); and also the organosiloxane polymers KP341 (Shin-Etsu Chemical Co., Ltd.) and BYK-302, BYK-307, BYK-322, BYK-323, BYK-330, BYK-333, BYK-370, BYK-375 and BYK-378 (BYK-Chemie Japan KK).

These surfactants may be used singly or two or more may be used in combination. The amount of surfactant used per 100 parts by weight of the triazine ring-containing polymer is preferably from 0.0001 to 5 parts by weight, more preferably from 0.001 to 1 part by weight, and even more preferably from 0.01 to 0.5 part by weight.

The crosslinking agent is not particularly limited, provided it is a compound having a substituent capable of reacting with the triazine ring-containing polymer of the invention.

Such compounds are exemplified by melamine compounds having a crosslink-forming substituent such as a methylol group or a methoxymethyl group, substituted urea compounds, compounds containing a crosslink-forming substituent such as an epoxy group or an oxetane group, compounds containing a blocked isocyanate group, compounds having an acid anhydride group, compounds having a (meth)acryl group, and phenoplast compounds. From the standpoint of heat resistance and storage stability, a compound containing an epoxy group, a blocked isocyanate group or a (meth)acryl group is preferred.

A blocked isocyanate group is also preferred in that, because it crosslinks by forming a urea linkage and has a carbonyl group, the refractive index does not decrease.

When used in the treatment of polymer chain ends, it suffices for these compounds to have at least one crosslink-forming substituent; however, when used in crosslinking treatment between polymers, they must have at least two crosslink-forming substituents.

The epoxy compound has at least two epoxy groups on the molecule. Upon exposure of this compound to an elevated temperature during heat curing, the epoxy rings open and the crosslinking reaction proceeds via an addition reaction with the triazine ring-containing polymer of the invention.

Illustrative examples of the crosslinking agent include
tris(2,3-epoxypropyl) isocyanate,
1,4-butanediol diglycidyl ether,
1,2-epoxy-4-(epoxyethyl)cyclohexane,
glycerol triglycidyl ether,
diethylene glycol diglycidyl ether,
2,6-diglycidylphenyl glycidyl ether,
1,1,3-tris[p-(2,3-epoxypropoxy)phenyl]propane,
1,2-cyclohexanedicarboxylic acid diglycidyl ester,
4,4'-methylenebis(N,N-diglycidylaniline),
3,4-epoxycyclohexylmethyl-3,4-epoxycyclohexanecarboxylate,
trimethylolethane triglycidyl ether,
bisphenol A diglycidyl ether and
pentaerythritol polyglycidyl ether.

Examples of commercial products that may be used include epoxy resins having at least two epoxy groups, such as YH-434 and YH-434L (from Tohto Kasei Co., Ltd.); epoxy resins having a cyclohexene oxide structure, such as Epolead GT-401, GT-403, GT-301 and GT-302, and also Celloxide 2021 and Celloxide 3000 (all from Daicel Chemical Industries, Ltd.); bisphenol A-type epoxy resins such as Epikote (now "jER") 1001, 1002, 1003, 1004, 1007, 1009, 1010 and 828 (all from Japan Epoxy Resin Co., Ltd.); bisphenol F-type epoxy resins such as Epikote (now "jER") 807 (Japan Epoxy Resin Co., Ltd.); phenol-novolak type epoxy resins such as Epikote (now "jER") 152 and 154 (Japan Epoxy Resin Co., Ltd.), and EPPN 201 and 202 (Nippon Kayaku Co., Ltd.); cresol-novolak type epoxy resins such as EOCN-102, EOCN-103S, EOCN-104S, EOCN-1020, EOCN-1025 and EOCN-1027 (Nippon Kayaku Co., Ltd.), and Epikote (now "jER") 180S75 (Japan Epoxy Resin Co., Ltd.); alicyclic epoxy resins such as Denacol EX-252 (Nagase ChemteX Corporation), CY175, CY177 and CY179 (Ciba-Geigy AG), Araldite CY-182, CY-192 and CY-184 (Ciba-Geigy AG), Epiclon 200 and 400 (DIC Corporation), Epikote (now "jER") 871 and 872 (Japan Epoxy Resin Co., Ltd.), and ED-5661 and ED-5662 (Celanese Coating KK); and aliphatic polyglycidyl ethers such as Denacol EX-611, EX-612, EX-614, EX-622, EX-411, EX-512, EX-522, EX-421, EX-313, EX-314 and EX-321 (Nagase ChemteX Corporation).

The acid anhydride compound is a carboxylic acid anhydride obtained by carrying out a dehydration/condensation reaction between two carboxylic acid molecules. Upon exposure to an elevated temperature during heat curing, the anhydride ring opens and the crosslinking reaction proceeds by way of an addition reaction with the triazine ring-containing polymer of the invention.

Illustrative examples of the acid anhydride compound include compounds having a single acid anhydride group on the molecule, such as phthalic anhydride, tetrahydrophthalic anhydride, hexahydrophthalic anhydride, methyl tetrahydrophthalic anhydride, methyl hexahydrophthalic anhydride, nadic anhydride, methyl nadic anhydride, maleic anhydride, succinic anhydride, octyl succinic anhydride and dodecenyl succinic anhydride; and compounds having two acid anhydride groups on the molecule, such as 1,2,3,4-cyclobutanetetracarboxylic dianhydride, pyromellitic anhydride, 3,4-dicarboxy-1,2,3,4-tetrahydro-1-naphthalenesuccinic dianhydride, bicyclo[3.3.0]octane-2,4,6,8-tetracarboxylic dianhydride, 5-(2,5-dioxotetrahydro-3-furanyl)-3-methyl-3-cyclohexene-1,2-dicarboxylic anhydride, 1,2,3,4-butanetetracarboxylic dianhydride, 3,3',4,4'-benzophenonetetracarboxylic dianhydride, 3,3',4,4'-biphenyltetracarboxylic dianhydride, 2,2-bis(3,4-dicarboxyphenyl)hexafluoropropane dianhydride and 1,3-dimethyl-1,2,3,4-cyclobutanetetracarboxylic dianhydride.

The (meth)acrylic compound is a compound having two or more (meth)acryl groups on the molecule. Upon exposure to an elevated temperature during heat curing, the crosslinking reaction proceeds by way of an addition reaction with the triazine ring-containing polymer of the invention.

Illustrative examples of the compound having (meth)acryl groups include ethylene glycol diacrylate, ethylene glycol dimethacrylate, polyethylene glycol diacrylate, polyethylene glycol dimethacrylate, ethoxylated bisphenol A diacrylate, ethoxylated bisphenol A dimethacrylate, ethoxylated trimethylolpropane triacrylate, ethoxylated trimethylolpropane trimethacrylate, ethoxylated glycerol triacrylate, ethoxylated glycerol trimethacrylate, ethoxylated pentaerythritol tetraacrylate, ethoxylated pentaerythritol tetramethacrylate, ethoxylated dipentaerythritol hexaacrylate, polyglycerol monoethylene oxide polyacrylate, polyglycerol polyethylene glycol polyacrylate, dipentaerythritol hexaacrylate, dipentaerythritol hexamethacrylate, neopentyl glycol diacrylate, neopentyl glycol dimethacrylate, pentaerythritol triacrylate, pentaerythritol trimethacrylate, trimethylolpropane triacrylate, trimethylolpropane trimethacrylate, tricyclodecane dimethanol diacrylate, tricyclodecane dimethanol dimethacrylate, 1,6-hexanediol diacrylate and 1,6-hexanediol dimethacrylate.

The above compound having (meth)acryl groups may be acquired as a commercial product, illustrative examples of which include NK Ester A-200, NK Ester A-400, NK Ester A-600, NK Ester A-1000, NK Ester A-TMPT, NK Ester UA-53H, NK Ester 1G, NK Ester 2G, NK Ester 3G, NK Ester 4G, NK Ester 9G, NK Ester 14G, NK Ester 23G, NK Ester ABE-300, NK Ester A-BPE-4, NK Ester A-BPE-6, NK Ester A-BPE-10, NK Ester A-BPE-20, NK Ester A-BPE-30, NK Ester BPE-80N, NK Ester BPE-100N, NK Ester BPE-200, NK Ester BPE-500, NK Ester BPE-900, NK Ester BPE-1300N, NK Ester A-GLY-3E, NK Ester A-GLY-9E, NK Ester A-GLY-20E, NK Ester A-TMPT-3E0, NK Ester A-TMPT-9E0, NK Ester ATM-4E and NK Ester ATM-35E (all from Shin-Nakamura Chemical Co., Ltd.); KAYARAD™ DPEA-12, KAYARAD™ PEG400DA, KAYARAD™ THE-330 and KAYARAD™ RP-1040 (all from Nippon Kayaku Co., Ltd.); M-210 and M-350 (from Toagosei Co., Ltd.); KAYARAD™ DPHA, KAYARAD™ NPGDA and KAYARAD™ PET30 (Nippon Kayaku Co., Ltd.); and NK Ester A-DPH, NK Ester A-TMPT, NK Ester A-DCP, NK Ester A-HD-N, NK Ester TMPT, NK Ester DCP, NK Ester NPG and NK Ester HD-N (all from Shin-Nakamura Chemical Co., Ltd.).

The compound containing blocked isocyanate groups is a compound having on the molecule at least two blocked isocyanate groups, i.e., isocyanate groups (—NCO) that have been blocked with a suitable protecting group, and in which, upon exposure of the compound to an elevated temperature during heat curing, the protecting groups (blocking moieties) are removed by thermal dissociation and the isocyanate groups that form as a result induce crosslinking reactions with the resin. This compound is exemplified by compounds having on the molecule at least two groups of the following formula (which groups may be the same or may each differ).

[Chemical Formula 20]

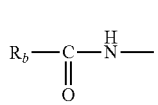

In the formula, $R_b$ is an organic group on the blocking moiety.

Such a compound can be obtained by, for example, reacting a suitable blocking agent with a compound having at least two isocyanate groups on the molecule.

Illustrative examples of compounds having at least two isocyanate groups on the molecule include polyisocyanates such as isophorone diisocyanate, 1,6-hexamethylene diisocyanate, methylenebis(4-cyclohexyl isocyanate) and trimethylhexamethylene diisocyanate, and also dimers and trimers thereof, as well as the reaction products of these with diols, triols, diamines or triamines.

Illustrative examples of the blocking agent include alcohols such as methanol, ethanol, isopropanol, n-butanol, 2-ethoxyhexanol, 2-N,N-dimethylaminoethanol, 2-ethoxyethanol and cyclohexanol; phenols such as phenol, o-nitrophenol, p-chlorophenol, and o-, m- or p-cresol; lactams such as ε-caprolactam; oximes such as acetone oxime, methyl ethyl ketone oxime, methyl isobutyl ketone oxime, cyclohexanone oxime, acetophenone oxime and benzophenone oxime; pyrazoles such as pyrazole, 3,5-dimethylpyrazole and 3-methylpyrazole; and thiols such as dodecanethiol and benzenethiol.

The compound containing blocked isocyanates may also be acquired as a commercial product, illustrative examples of which include B-830, B-815N, B-842N, B-870N, B-874N, B-882N, B-7005, B7030, B-7075 and B-5010 (all from Mitsui Chemicals Polyurethane, Inc.); Duranate™ 17B-60PX, TPA-B80E, MF-B60X, MF-K60X and E402-B80T (all from Asahi Kasei Chemicals Corporation); and KarenzMOI-BM™ (Showa Denko KK).

Aminoplast compounds are compounds which have at least two methoxymethylene groups on the molecule. Upon exposure to an elevated temperature during heat curing, crosslinking reactions proceed by way of demethanolization/condensation reactions with the triazine ring-containing polymer of the invention.

Illustrative examples of melamine compounds include the Cymel series, such as hexamethoxymethylmelamine (Cymel™ 303), tetrabutoxymethylglycoluril (Cymel™ 1170) and tetramethoxymethylbenzoguanamine (Cymel™ 1123) (all from Nihon Cytec Industries, Inc.); and the Nikalac™ series, including the methylated melamine resins Nikalac™ MW-30HM, MW-390, MW-100LM and MX-750LM, and the methylated urea resins Nikalac™ MX-270, MX-280 and MX-290 (all from Sanwa Chemical Co., Ltd.).

Oxetane compounds are compounds which have at least two oxetanyl groups on the molecule. Upon exposure to an elevated temperature during heat curing, crosslinking reactions proceed by way of addition reactions with the triazine ring-containing polymer of the invention.

Examples of compounds having oxetane groups include the oxetane group-bearing compounds OXT-221, OX-SQ-H and OX-SC (from Toagosei Co., Ltd.).

Phenoplast compounds are compounds which have at least two hydroxymethylene groups on the molecule. Upon exposure to an elevated temperature during heat curing, crosslinking reactions proceed by way of dehydration/condensation reactions with the triazine ring-containing polymer of the invention.

Illustrative examples of phenoplast compounds include 2,6-dihydroxymethyl-4-methylphenol, 2,4-dihydroxymethyl-6-methylphenol, bis(2-hydroxy-3-hydroxymethyl-5-methylphenyl)methane, bis(4-hydroxy-3-hydroxymethyl-5-methylphenyl)methane, 2,2-bis(4-hydroxy-3,5-dihydroxymethylphenyl)propane, bis(3-formyl-4-hydroxyphenyl)methane, bis(4-hydroxy-2,5-dimethylphenyl)formylmethane and α,α-bis(4-hydroxy-2,5-dimethylphenyl)-4-formyltoluene.

The phenoplast compound may also be acquired as a commercial product, illustrative examples of which include 26DMPC, 46DMOC, DM-BIPC-F, DM-BIOC-F, TM-BIP-A, BISA-F, BI25X-DF and BI25X-TPA (all from Asahi Organic Chemicals Industry Co., Ltd.).

These crosslinking agents may be used singly or two or more may be used in combination. The amount of crosslinking agent used per 100 parts by weight of the triazine ring-containing polymer is preferably from 1 to 100 parts by weight. From the standpoint of the solvent resistance, the lower limit is preferably 10 parts by weight, and more preferably 20 parts by weight. From the standpoint of control of the refractive index, the upper limit is preferably 50 parts by weight, and more preferably 30 parts by weight.

When a crosslinking agent is used, the crosslinking agent reacts with reactive end-group substituents on the triazine ring-containing polymer, which may make it possible to achieve such advantageous effects as increasing the film density, increasing the heat resistance and increasing the thermal relaxation properties.

Ingredients other than the above may also be added in any step during preparation of the inventive composition.

The film-forming composition of the invention, by being applied onto a base material and subsequently heated where necessary, is able to form a desired film.

Any suitable method may be used for applying the composition, such as spin coating, dipping, flow coating, inkjet printing, spraying, bar coating, gravure coating, slit coating, roll coating, transfer printing, brush coating, blade coating and air knife coating.

Illustrative examples of the base material include silicon, indium-tin oxide (ITO)-coated glass, indium zinc oxide (IZO)-coated glass, polyethylene terephthalate (PET), plastic, glass, quartz and ceramic. Use can also be made of a flexible base material having flexibility.

The temperature at which baking is carried out in order to evaporate the solvent is not subject to any particular limitation. For example, baking may be carried out at between 40 and 400° C. In such cases, to achieve more uniform film formability or to induce the reaction to proceed on the base material, temperature change may be carried out in two or more stages.

The baking process is not particularly limited. For example, solvent evaporation may be effected using a hot plate or an oven, and under a suitable atmosphere, such as in open air, in nitrogen or another inert gas, or in a vacuum.

As for the bake temperature and time, conditions which are compatible with the processing steps for the target electronic device should be selected. Bake conditions such that the physical values of the resulting film conform to the required characteristics of the electronic device should be selected.

Because the film made of the inventive composition that has been obtained in this way is able to achieve a high heat resistance, high transparency, high refractive index, high solubility and low volume shrinkage, it can be advantageously used as a component in the fabrication of electronic devices such as liquid-crystal displays, organic electroluminescent (EL) displays, optical semiconductor (LED) devices, solid-state image sensors, organic thin-film solar cells, dye-sensitized solar cells and organic thin-film transistors (TFT).

Where necessary, other resins (thermoplastic resins or thermoset resins) may be included in the inventive composition.

Illustrative, non-limiting, examples of such other resins include the following thermoplastic resins: polyolefin resins such as polyethylene (PE), polypropylene (PP), ethylene-vinyl acetate copolymers (EVA), and ethylene-ethyl acrylate copolymers (EEA); polystyrene resins such as polystyrene (PS), high-impact polystyrene (HIPS), acrylonitrile-styrene copolymers (AS), acrylonitrile-butadiene-styrene copolymers (ABS) and methyl methacrylate-styrene copolymers (MS); polycarbonate resins; vinyl chloride resins; polyamide resins; polyimide resins; (meth)acrylic resins such as polymethyl methacrylate (PMMA); polyester resins such as polyethylene terephthalate (PET), polybutylene terephthalate, polyethylene naphthalate, polybutylene naphthalate, polylactic acid (PLA), poly-3-hydroxybutyric acid, poly-caprolactone, polybutylene succinate and polyethylene succinate/adipate; polyphenylene ether resins; modified polyphenylene ether resins; polyacetal resins; polysulfone resins; polyphenylene sulfide resins; polyvinyl alcohol resins; polyglycolic acid; modified starch; cellulose acetate and cellulose triacetate; chitin and chitosan; and lignin. Other exemplary resins include also thermoset resins such as phenolic resins, urea resins, melamine resins, unsaturated polyester resins, polyurethane resins and epoxy resins.

These resins may be used singly or two or more may be used in combination. The amount in which such resins are used per 100 parts by weight of the triazine ring-containing polymer is preferably from 1 to 10,000 parts by weight, and more preferably from 1 to 1,000 parts by weight.

For example, a composition with a (meth)acrylic resin may be obtained by including a (meth)acrylate compound in the composition and polymerizing the (meth)acrylate compound.

Illustrative examples of (meth)acrylate compounds include methyl (meth)acrylate, ethyl (meth)acrylate, ethylene glycol di(meth)acrylate, tetraethylene glycol di(meth)acrylate, polyethylene glycol di(meth)acrylate, propylene glycol di(meth)acrylate, polypropylene glycol di(meth)acrylate, 1,4-butanediol di(meth)acrylate, 1,6-hexanediol di(meth)acrylate, neopentylglycol di(meth)acrylate, trimethylolpropane trioxyethyl (meth)acrylate, tricyclodecane dimethanol di(meth)acrylate, tricyclodecanyl di(meth)acrylate, trimethylolpropane trioxypropyl (meth)acrylate, tris-2-hydroxyethyl isocyanurate tri(meth)acrylate, tris-2-hydroxyethyl isocyanurate di(meth)acrylate, 1,9-nonanediol di(meth)acrylate, pentaerythritol di(meth)acrylate, glycerol methacrylate acrylate, pentaerythritol tri(meth)acrylate, trimethylolpropane trimethacrylate, allyl (meth)acrylate, vinyl (meth)acrylate, epoxy (meth)acrylate, polyester (meth)acrylate and urethane (meth)acrylate.

The polymerization of these (meth)acrylate compounds may be carried out by light irradiation or heating in the presence of a photoradical initiator or a thermal radical initiator.

Examples of photoradical initiators include acetophenones, benzophenones, Michler's benzoyl benzoate, amyloxime ester, tetramethylthiuram monosulfide and thioxanthones.

Photocleavable photoradical initiators are especially preferred. Photocleavable photoradical initiators are listed on page 159 of *Saishin UV K•ka Gijutsu* [Recent UV Curing Technology] (publisher, K. Takausu; published by Gijutsu Joho Kyokai KK; 1991).

Examples of commercial photoradical initiators include those available from CIBA Japan under the trade names Irgacure 184, 369, 651, 500, 819, 907, 784, 2959, CGI1700, CGI1750, CGI1850 and CG24-61, and the trade names Darocur 1116 and 1173; that available from BASF under the trade name Lucirin TPO; that available from UCB under the trade name Ubecryl P36; and those available under the trade names Esacure KIP150, KIP65LT, KIP100F, KT37, KT55, KT046 and KIP75/B from the Fratelli Lamberti Company.

The photoradical initiator is used in the range of preferably from 0.1 to 15 parts by weight, and more preferably from 1 to 10 parts by weight, per 100 parts by weight of the (meth)acrylate compound.

The solvent used in polymerization is exemplified by the same solvents as those mentioned above for the film-forming composition.

EXAMPLES

The invention is illustrated more fully below by way of Examples, although the invention is not limited by these Examples. The instruments used for measurement in the Examples were as follows.

$^1$H-NMR
    Instruments: Varian NMR System 400 NB (400 MHz)
        JEOL-ECA700 (700 MHz)
    Solvent used in measurement: DMSO-d6
    Reference material: Tetramethylsilane (TMS) ($\delta$=0.0 ppm)

GPC
(1) Tetrahydrofuran (THF) System
    Instrument: HLC-8200 GPC (Tosoh Corporation)
    Columns: Shodex KF-802.5L+KF-803L
    Column temperature: 40° C.
    Solvent: THF
    Detector: UV (254 nm)
    Calibration curve: polystyrene standard
(2) Dimethylformamide (DMF) System
    Instrument: HLC-8200 GPC (Tosoh Corporation)
    Columns: Shodex OHpak SB-803HQ+SB-804HQ
    Column temperature: 40° C.
    Solvent: DMF
    Detector: UV (254 nm)
    Calibration curve: polystyrene standard
(3) N-Methylpyrrolidone (NMP) System
    Instrument: Shimadzu SPD-10A VP
    Columns: Shodex K-804L, K-805L
    Column temperature: 60° C.
    Solvent: NMP
    Detector: UV (254 nm)
    Calibration curve: polystyrene standard Ellipsometer
  Instrument: VASE multiple incident angle spectroscopic ellipsometer (JA Woollam Japan)
Thermogravimetric/Differential Thermal Analyzer (TG-DTA)
  Instrument: TG-8120 (Rigaku Corporation)
  Temperature ramp-up rate: 10° C./min
  Measurement temperatures: 25° C. to 750° C.
DSC
  Instrument: NETZSCH DSC204 F1 Phenix
  Temperature ramp-up rate: 40 K/min Example 1

Synthesis of Polymeric Compound [4]

[Chemical Formula 21]

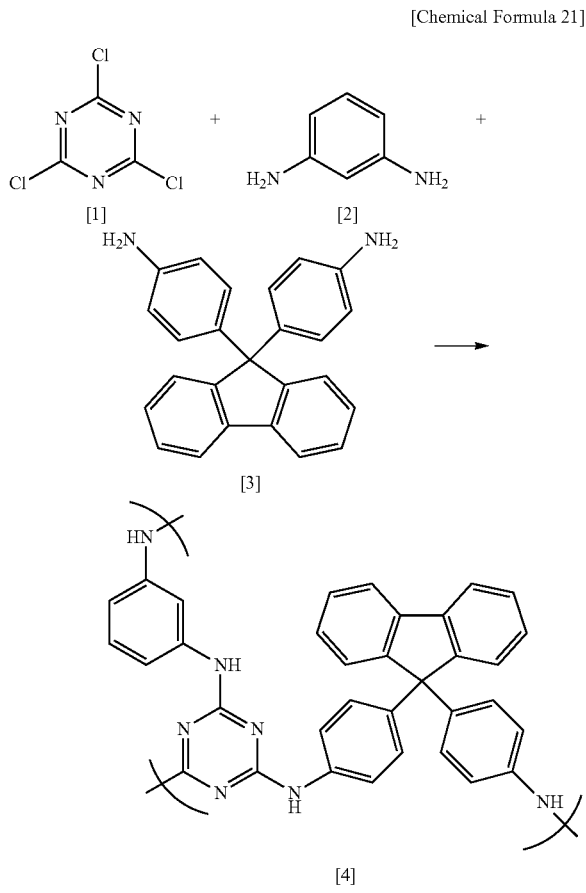

[4]

Under a nitrogen atmosphere, 185 g of dimethylacetamide (DMAc) was added to a 500 mL four-neck flask and cooled to −10° C. in an acetone bath to which dry ice was added, following which 56.04 g (0.3 mol) of 2,4,6-trichloro-1,3,5-triazine [1] (Evonik Degussa) was added and dissolved therein. Next, a solution of 39.70 g (0.37 mol) of m-phenylenediamine [2], 4.41 g (0.04 mol) of bisaminophenylfluorene [3] and 9.61 g (0.10 mol) of aniline dissolved in 125 g of DMAc was added dropwise. Following dropwise addition, the flask contents were stirred for 30 minutes and the resulting reaction solution was added dropwise using a pipette pump to a reactor consisting of a 1,000 mL four-neck flask to which had already been added 252 g of DMAc and which had been heated beforehand to 85° C. on an oil bath. After one hour, 74.32 g (0.80 mol) of aniline was added dropwise, and the flask contents were stirred for 1 hour.

The system was allowed to cool to room temperature, after which 91.07 g (0.90 mol) of triethylamine was added, the by-product hydrogen chloride was removed, and the hydrochloride that formed was subjected to filtration. The filtrate was reprecipitated in a mixed solution of 28% ammonia water (182.14 g) and 3,367 g of ion-exchanged water. The precipitate was collected by filtration, re-dissolved in 422 g of THF, then reprecipitated in a mixed solution of 3,000 g of ion-exchanged water and 100 g of methanol. The resulting precipitate was collected by filtration and dried in a vacuum desiccator at 150° C. for 8 hours, yielding 73.33 g of the target polymeric compound [4] (abbreviated below as "HB-TDFA03").

FIG. 1 shows the measured $^1$H-NMR spectrum for HB-TDFA03. The HB-TDFA03 thus obtained is a compound having structural units of formula (1). The polystyrene-equivalent weight-average molecular weight Mw of HB-TDFA03, as measured by GPC (THF system), was 5,400, and the polydispersity Mw/Mn was 4.05.

Example 2

5% Weight Loss Measurement for HB-TDFA03

An amount of 5.73 mg of the HB-TDFA03 obtained in Example 1 was added to a platinum pan, and measurement with a TG-DTA was carried out at a temperature ramp-up rate of 15° C./min. The results are shown in FIG. 2. The 5% weight loss temperature was 408° C. The glass transition temperature was measured by DSC, whereupon a transition point was observed at 227° C.

Example 3

Measurement of Refractive Index

The HB-TDFA03 obtained in Example 1 (0.1 g) was dissolved in 0.9 g of cyclohexanone, giving a clear, light yellow-colored solution. Using a spin coater, the resulting polymer varnish was spin-coated onto a glass substrate for 5 seconds at 200 rpm and for 30 seconds at 2,000 rpm, following which the solvent was removed by 1 minute of heating at 100° C. and 5 minutes of heating at 300° C., thereby giving a film. The refractive index of the resulting film was measured, whereupon the refractive index at 550 nm was 1.772.

Example 4

Synthesis of Polymeric Compound [4]

Aside from setting the amounts in which the reagents were charged to 33.19 g (0.18 mol) of 2,4,6-trichloro-1,3,5-triazine [1] (Evonik Degussa), 23.85 g (0.22 mol) of m-phenylenediamine [2], 8.55 g (0.024 mol) of bisaminophenylfluorene [3] and 5.7 g (0.06 mol) of aniline, the reaction was carried out in the same way as in Example 1, yielding 57.19 g of the target polymeric compound [4] (abbreviated below as "HB-TDFA10").

FIG. 3 shows the measured $^1$H-NMR spectrum for HB-TDFA10. The HB-TDFA10 thus obtained is a compound having structural units of formula (1). The polystyrene-equivalent weight-average molecular weight Mw of HB- TDFA10, as measured by GPC (THF system), was 6,200, and the polydispersity Mw/Mn was 4.53.

Example 5

5% Weight Loss Measurement for HB-TDFA10

TG-DTA measurement of the HB-TDFA10 obtained in Example 4 was carried out in the same way as in Example 2, whereupon the 5% weight loss temperature was 414° C. The results are shown in FIG. 4.

Example 6

Measurement of Refractive Index

The HB-TDFA10 obtained in Example 4 (0.1 g) was dissolved in 0.9 g of cyclohexanone, giving a clear, light yellow-colored solution. Using a spin coater, the resulting polymer varnish was spin-coated onto a glass substrate for 5 seconds at 200 rpm and for 30 seconds at 2,000 rpm, following which the solvent was removed by 1 minute of heating at 100° C. and 5 minutes of heating at 300° C., thereby giving a film. The refractive index of the resulting film was measured, whereupon the refractive index at 550 nm was 1.764.

Example 7

Synthesis of Polymeric Compound [4]

Aside from setting the amounts in the which the reagents were charged to 3.38 g (0.018 mol) of 2,4,6-trichloro-1,3,5-triazine [1] (Evonik Degussa), 1.70 g (0.015 mol) of m-phenylenediamine [2], 2.37 g (0.007 mol) of bisaminophenylfluorene [3] and 0.57 g (0.06 mol) of aniline, the reaction was carried out in the same way as in Example 1, yielding 5.79 g of the target polymeric compound [4] (abbreviated below as "HB-TDFA30").

FIG. 5 shows the measured $^1$H-NMR spectrum for HB-TDFA30. The HB-TDFA30 thus obtained is a compound having structural units of formula (1). The polystyrene-equivalent weight-average molecular weight Mw of HB-TDFA30, as measured by GPC (THF system), was 5,800, and the polydispersity Mw/Mn was 2.78.

Example 8

5% Weight Loss Measurement for HB-TDFA30

TG-DTA measurement of the HB-TDFA30 obtained in Example 7 was carried out in the same way as in Example 2, whereupon the 5% weight loss temperature was 423° C. The results are shown in FIG. 6.

Example 9

Measurement of Refractive Index

The HB-TDFA30 obtained in Example 7 (0.1 g) was dissolved in 0.9 g of cyclohexanone, giving a clear, light yellow-colored solution. Using a spin coater, the resulting polymer varnish was spin-coated onto a glass substrate for 5 seconds at 200 rpm and for 30 seconds at 2,000 rpm, following which the solvent was removed by 1 minute of heating at 100° C. and 5 minutes of heating at 300° C., thereby giving a film. The refractive index of the resulting film was measured, whereupon the refractive index at 550 nm was 1.762.

Example 10

Synthesis of Polymeric Compound [4]

Aside from setting the amounts in which the reagents were charged to 3.33 g (0.018 mol) of 2,4,6-trichloro-1,3,5-triazine [1] (Evonik Degussa), 1.23 g (0.011 mol) of m-phenylenediamine [2], 3.92 g (0.011 mol) of bisaminophenylfluorene [3] and 0.59 g (0.06 mol) of aniline, the reaction was carried out in the same way as in Example 1, yielding 6.65 g of the target polymeric compound [4] (abbreviated below as "HB-TDFA50").

FIG. 7 shows the measured $^1$H-NMR spectrum for HB-TDFA50. The HB-TDFA50 thus obtained is a compound having structural units of formula (1). The polystyrene-equivalent weight-average molecular weight Mw of HB-TDFA50, as measured by GPC (THF system), was 6,400, and the polydispersity Mw/Mn was 2.80.

Example 11

5% Weight Loss Measurement for HB-TDFA50

TG-DTA measurement of the HB-TDFA50 obtained in Example 10 was carried out in the same way as in Example 2, whereupon the 5% weight loss temperature was 465° C. The results are shown in FIG. 8.

Example 12

Measurement of Refractive Index

The HB-TDFA50 obtained in Example 10 (0.1 g) was dissolved in 0.9 g of cyclohexanone, giving a clear, light yellow-colored solution. Using a spin coater, the resulting polymer varnish was spin-coated onto a glass substrate for 5 seconds at 200 rpm and for 30 seconds at 2,000 rpm, following which the solvent was removed by 1 minute of heating at 100° C. and 5 minutes of heating at 300° C., thereby giving a film. The refractive index of the resulting film was measured, whereupon the refractive index at 550 nm was 1.750.

Example 13

Refractive Index Modification, Heat Curing Test

The HB-TDFA50 obtained in Example 10 was added in amounts of 10, 30, 50 and 70 wt % relative to the cross-linking agent dipentaerythritol hexaacrylate (Nippon Kayaku Co., Ltd.), and cyclohexane solutions having a solids content of 10 wt % were prepared. The solutions were spin-coated onto glass substrates for 5 seconds at 200 rpm and for 30 seconds at 1,500 rpm. The solvent was then removed by a 1-minute bake at 100° C. and a 5-minute bake at 250° C. The refractive indices and film thicknesses of the respective films thus obtained were measured. The results are shown in Table 1.

Example 14

The films produced in Example 13 were immersed in cyclohexanone, then spray-dried 5 minutes later, after which the refractive indices and the film thicknesses were measured in the same way as in Example 13. Those results are also shown in Table 1.

TABLE 1

| Amount added (wt %) | Refractive index (at 550 nm) | Film thickness (nm) | Film thickness after immersion (nm) |
|---|---|---|---|
| 10 | 1.562 | 200 | 209 |
| 30 | 1.631 | 168 | 170 |
| 50 | 1.681 | 226 | 235 |
| 70 | 1.712 | 297 | 299 |

As shown in Table 1, because marked changes in the refractive indices and film thicknesses were not observed after heat curing, it is apparent that use as thermoset compositions is possible. Also, the refractive index was confirmed to rise as the amount of hyperbranched polymer (HB-TDFA50) added increased. Hence, this polymer was found to be capable of use as a refractive index modifier.

Example 15

The HB-TDFA50 obtained in Example 10 was added in amounts of 10, 30, 50 and 70 wt % relative to the cross-linking agent Takenate B882N (Mitsui Chemicals, Inc.), and cyclohexane solutions having a solids content of 10 wt % were prepared. The solutions were spin-coated onto glass substrates for 5 seconds at 200 rpm and for 30 seconds at 1,500 rpm. The solvent was then removed by a 1-minute bake at 100° C. and a 5-minute bake at 250° C. The refractive indices and film thicknesses of the respective films thus obtained were measured. The results are shown in Table 2.

Example 16

The films produced in Example 15 were immersed in cyclohexanone, then spray-dried 5 minutes later, after which the refractive indices and the film thicknesses were measured in the same way as in Example 15. Those results are also shown in Table 2.

TABLE 2

| Amount added (wt %) | Refractive index (at 550 nm) | Film thickness (nm) | Film thickness after immersion (nm) |
|---|---|---|---|
| 10 | 1.608 | 91 | 93 |
| 30 | 1.690 | 124 | 123 |
| 50 | 1.722 | 199 | 199 |
| 70 | 1.726 | 294 | 295 |

As shown in Table 2, because marked changes in the refractive indices and film thicknesses were not observed after heat curing, it is apparent that use as thermoset compositions is possible. Also, the refractive index was confirmed to rise as the amount of hyperbranched polymer (HB-TDFA50) added increased. Hence, this polymer was found to be capable of use as a refractive index modifier.

Example 17

Synthesis of Polymeric Compound [6]

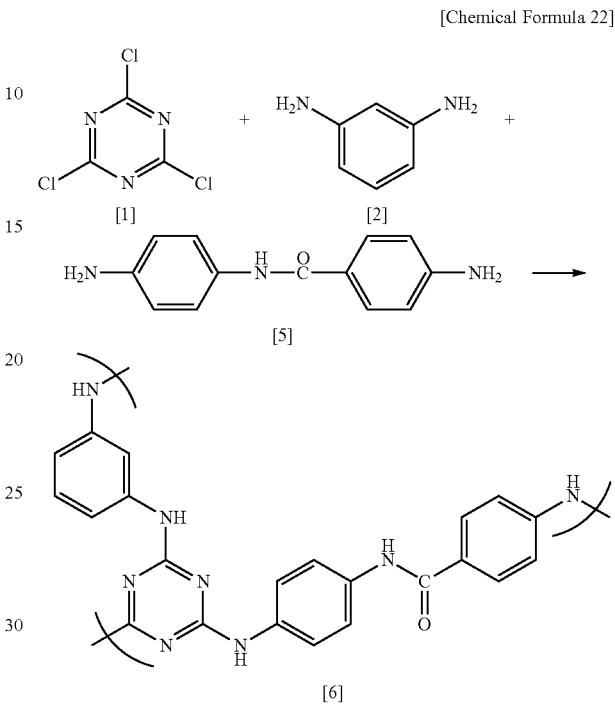

[Chemical Formula 22]

Aside from setting the reagents and the amounts in which they were charged to 3.69 g (0.02 mol) of 2,4,6-trichloro-1,3,5-triazine [1] (Evonik Degussa), 1.30 g (0.012 mol) of m-phenylenediamine[2], 2.73 g (0.012 mol) of 4,4'-diaminobenzanilide[5] and 5.59 g (0.06 mol) of aniline, the reaction was carried out in the same way as in Example 1, yielding 6.2 g of the target polymeric compound [6] (abbreviated below as "HB-TAM-mDA").

FIG. 9 shows the measured $^1$H-NMR spectrum for HB-TAM-mDA. The HB-TAM-mDA thus obtained is a compound having structural units of formula (1). The polystyrene-equivalent weight-average molecular weight Mw of HB-TAM-mDA, as measured by GPC (DMF system), was 185,000, and the polydispersity Mw/Mn was 39.2.

Example 18

5% Weight Loss Measurement for HB-TAM-mDA

TG-DTA measurement of the HB-TAM-mDA obtained in Example 17 was carried out in the same way as in Example 2, whereupon the 5% weight loss temperature was 417° C. The results are shown in FIG. 10.

Example 19

Measurement of Refractive Index

The HB-TAM-mDA obtained in Example 17 (0.1 g) was dissolved in 0.9 g of cyclohexanone, giving a clear, light yellow-colored solution. Using a spin coater, the resulting polymer varnish was spin-coated onto a glass substrate for 5 seconds at 200 rpm and for 30 seconds at 2,000 rpm, following which the solvent was removed by 1 minute of heating at 100° C. and 5 minutes of heating at 300° C., thereby giving a film. The refractive index of the resulting film was measured, whereupon the refractive index at 550 nm was 1.843.

Example 20

Synthesis of Polymeric Compound [7]

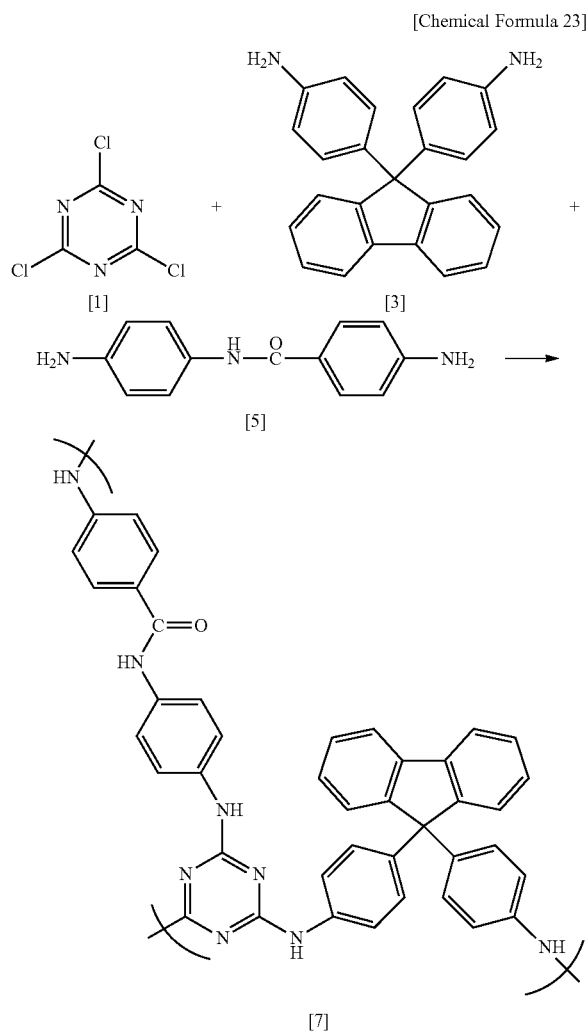

Aside from setting the reagents and the amounts in which they were charged to 2.77 g (0.015 mol) of 2,4,6-trichloro-1,3,5-triazine [1] (Evonik Degussa), 1.36 g (0.0039 mol) of bisaminophenylfluorene [3], 3.55 g (0.0156 mol) of 4,4'-diaminobenzanilide[5] and 4.19 g (0.045 mol) of aniline, the reaction was carried out in the same way as in Example 1, yielding 6.0 g of the target polymeric compound [7] (abbreviated below as "HB-TAM-FA").

FIG. 11 shows the measured $^1$H-NMR spectrum for HB-TAM-FA. The HB-TAM-FA thus obtained is a compound having structural units of formula (1). The polystyrene-equivalent weight-average molecular weight Mw of HB-TAM-FA, as measured by GPC (DMF system), was 183,000, and the polydispersity Mw/Mn was 55.9.

Example 21

5% Weight Loss Measurement for HB-TAM-FA

TG-DTA measurement of the HB-TAM-FA obtained in Example 20 was carried out in the same way as in Example 2, whereupon the 5% weight loss temperature was 400° C. The results are shown in FIG. 12.

Example 22

Measurement of Refractive Index

The HB-TAM-FA obtained in Example 20 (0.1 g) was dissolved in 0.9 g of cyclohexanone, giving a clear, light yellow-colored solution. Using a spin coater, the resulting polymer varnish was spin-coated onto a glass substrate for 5 seconds at 200 rpm and for 30 seconds at 2,000 rpm, following which the solvent was removed by 1 minute of heating at 100° C. and 5 minutes of heating at 300° C., thereby giving a film. The refractive index of the resulting film was measured, whereupon the refractive index at 550 nm was 1.818.

Example 23

Synthesis of Polymeric Compound [6]

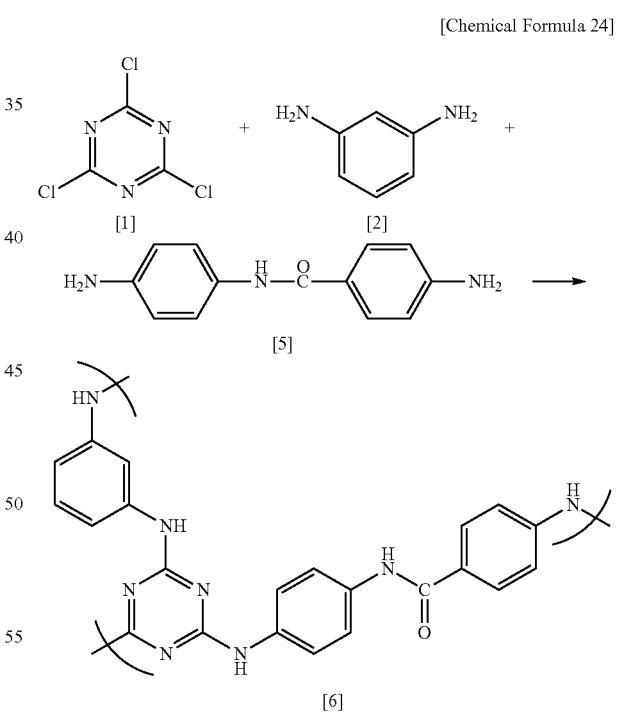

Aside from setting the reagents and the amounts in which they were charged to 23.05 g (0.125 mol) of 2,4,6-trichloro-1,3,5-triazine [1] (Evonik Degussa), 5.95 g (0.0550 mol) of m-phenylenediamine[2], 18.75 g (0.0825 mol) of 4,4'-diaminobenzanilide[5] and 34.92 g (0.375 mol) of aniline, the reaction was carried out in the same way as in Example 1, yielding 40.18 g of the target polymeric compound [6] (abbreviated below as "TAmD32").

FIG. 13 shows the measured ¹H-NMR spectrum for TAmD32. The TAmD32 thus obtained is a compound having structural units of formula (1). The polystyrene-equivalent weight-average molecular weight Mw of TAmD32, as measured by GPC (NMP system), was 32,100, and the polydispersity Mw/Mn was 4.9.

Example 24

5% Weight Loss Measurement for TAmD32

TG-DTA measurement of the TAmD32 obtained in Example 23 was carried out in the same way as in Example 2, whereupon the 5% weight loss temperature was 427° C. The results are shown in FIG. 14.

Example 25

Measurement of Refractive Index

The TAmD32 obtained in Example 23 (0.1 g) was dissolved in 0.9 g of cyclohexanone, giving a clear, light yellow-colored solution. Using a spin coater, the resulting polymer varnish was spin-coated onto a glass substrate for 5 seconds at 200 rpm and for 30 seconds at 2,000 rpm, following which the solvent was removed by 1 minute of heating at 100° C. and 5 minutes of heating at 250° C., thereby giving a film. The refractive index of the resulting film was measured, whereupon the refractive index at 550 nm was 1.824.

What is claimed is:

1. A copolymeric hyperbranched triazine ring-containing polymer characterized by comprising a recurring unit structure of formula (1) below

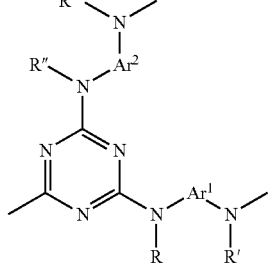

(1)

wherein R, R', R" and R''' are each independently a hydrogen atom, an alkyl group, an alkoxy group, an aryl group or an aralkyl group; $Ar^1$ and $Ar^2$ differ from each other and $Ar^1$ and $Ar^2$ are at least one selected from the group consisting of formulas (2) to (11), (13) to (18) and (22) below with the proviso that at least one of $Ar^1$ and $Ar^2$ is at least one selected from the group (11), (14), (15), and (22)

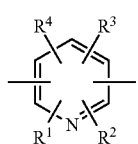

(2)

-continued

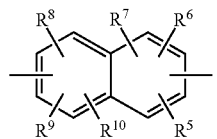

(3)

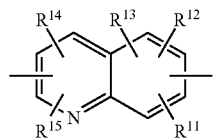

(4)

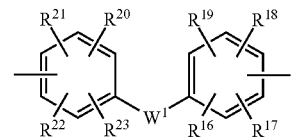

(5)

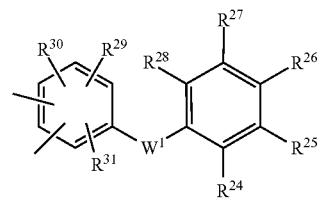

(6)

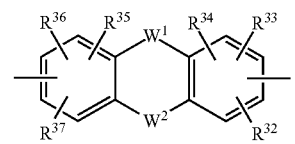

(7)

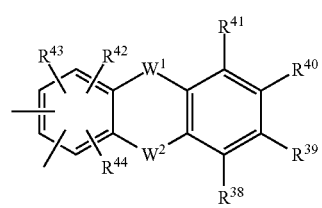

(8)

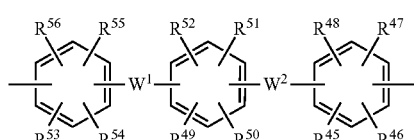

(9)

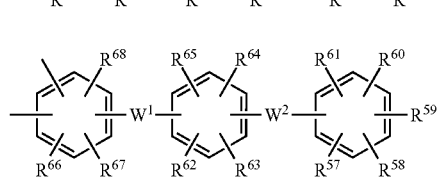

(10)

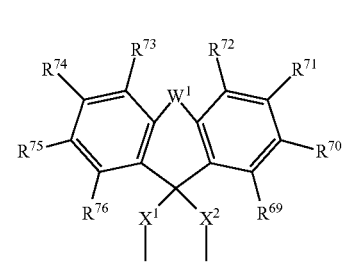

(11)

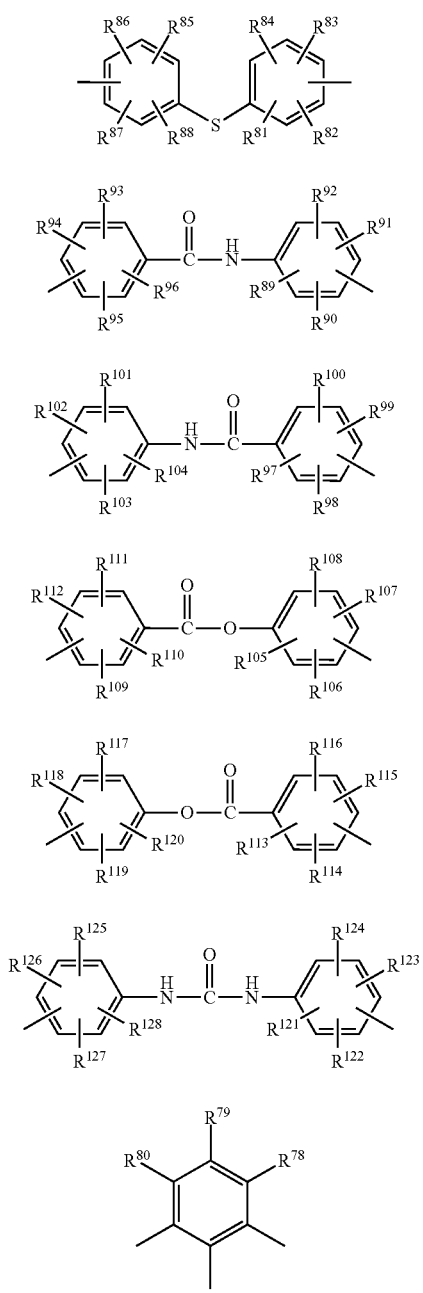

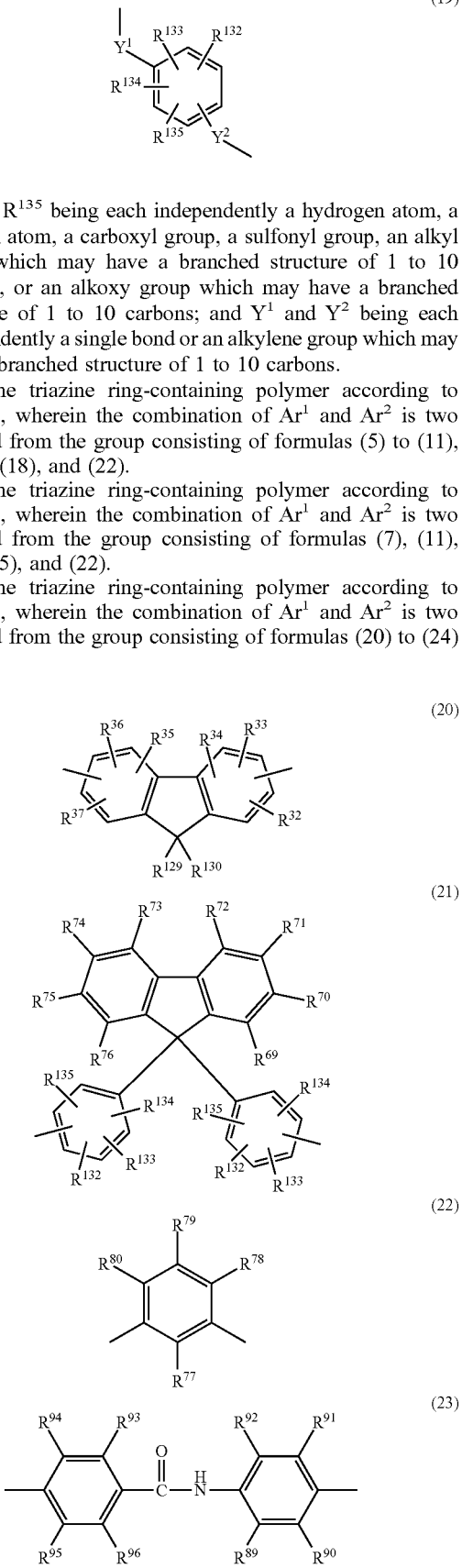

$R^{132}$ to $R^{135}$ being each independently a hydrogen atom, a halogen atom, a carboxyl group, a sulfonyl group, an alkyl group which may have a branched structure of 1 to 10 carbons, or an alkoxy group which may have a branched structure of 1 to 10 carbons; and $Y^1$ and $Y^2$ being each independently a single bond or an alkylene group which may have a branched structure of 1 to 10 carbons.

2. The triazine ring-containing polymer according to claim 1, wherein the combination of $Ar^1$ and $Ar^2$ is two selected from the group consisting of formulas (5) to (11), (14) to (18), and (22).

3. The triazine ring-containing polymer according to claim 1, wherein the combination of $Ar^1$ and $Ar^2$ is two selected from the group consisting of formulas (7), (11), (14), (15), and (22).

4. The triazine ring-containing polymer according to claim 1, wherein the combination of $Ar^1$ and $Ar^2$ is two selected from the group consisting of formulas (20) to (24)

wherein $R^1$ to $R^{128}$ are each independently a hydrogen atom, a halogen atom, a carboxyl group, a sulfonyl group, an alkyl group which may have a branched structure of 1 to 10 carbons, or an alkoxy group which may have a branched structure of 1 to 10 carbons; $W^1$ and $W^2$ are each independently a single bond, $CR^{129}R^{130}$ ($R^{129}$ and $R^{130}$ being each independently a hydrogen atom or an alkyl group which may have a branched structure of 1 to 10 carbons, with the proviso that $R^{129}$ and $R^{130}$ may together form a ring), C=O, O, S, SO, $SO_2$ or $NR^{131}$ ($R^{131}$ being a hydrogen atom or an alkyl group which may have a branched structure of 1 to 10 carbons); and $X^1$ and $X^2$ are each independently a single bond, an alkylene group which may have a branched structure of 1 to 10 carbons, or a group of formula (19) below -continued (24)

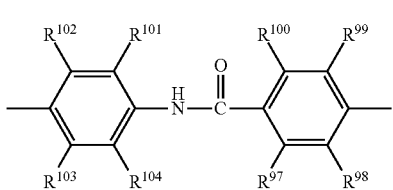

wherein $R^{32}$ to $R^{37}$, $R^{69}$ to $R^{80}$, $R^{89}$ to $R^{104}$, $R^{129}$, $R^{130}$ and $R^{132}$ to $R^{135}$ are as defined above.

5. The triazine ring-containing polymer according to claim 1, wherein the recurring unit structure includes the structure of formula (25) below (25)

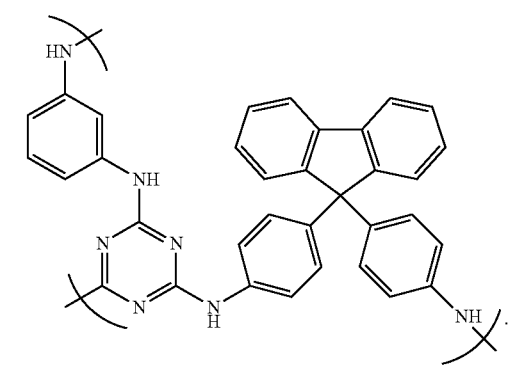

6. The triazine ring-containing polymer according to claim 1, wherein the recurring unit structure includes the structure of formula (26) below (26)

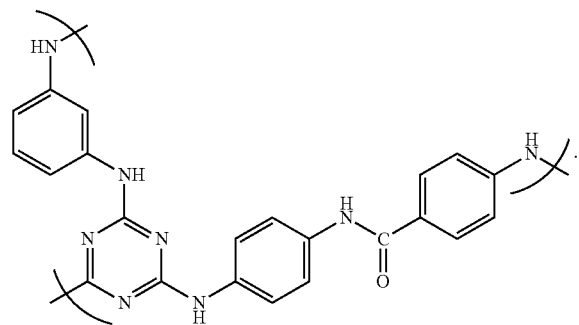

7. The triazine ring-containing polymer according to claim 1, wherein the recurring unit structure includes the structure of formula (27) below (27)

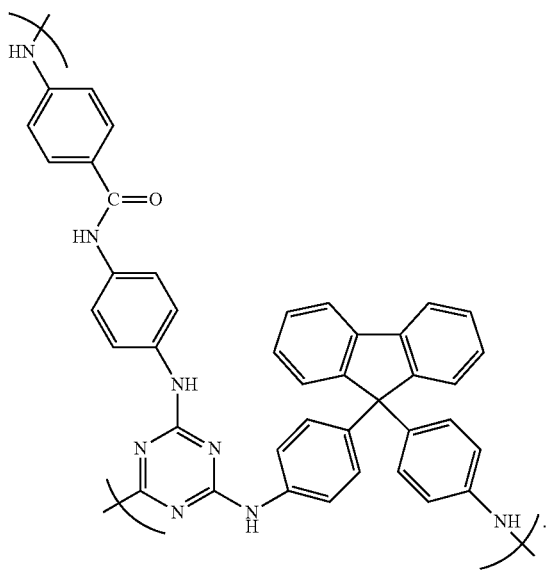

8. A film-forming composition comprising the triazine ring-containing polymer of claim 1.

9. A film obtained from the film-forming composition of claim 8.

10. A film comprising the triazine ring-containing polymer according to claim 1.

11. An electronic device comprising a base material and the film of claim 9 formed on the base material.

12. An electronic device comprising a base material and the film of claim 10 formed on the base material.

13. An optical member comprising a base material and the film of claim 9 formed on the base material.

14. An optical member comprising a base material and the film of claim 10 formed on the base material.

15. A solid-state image sensor formed of a charge-coupled device or a complementary metal oxide semiconductor, the sensor comprising at least one layer of the film of claim 9.

16. A solid-state image sensor formed of a charge-coupled device or a complementary metal oxide semiconductor, the sensor comprising at least one layer of the film of claim 10.

17. A solid-state image sensor comprising, as a planarization layer on a color filter, the film of claim 9.

18. A solid-state image sensor comprising, as a planarization layer on a color filter, the film of claim 10.

* * * * *